(12) United States Patent
Choi et al.

(10) Patent No.: US 10,651,194 B2
(45) Date of Patent: *May 12, 2020

(54) SEMICONDUCTOR DEVICE INCLUDING DIELECTRIC LAYER

(71) Applicant: SAMSUNG ELECTRONICS CO., LTD., Suwon-si, Gyeonggi-do (KR)

(72) Inventors: Ji Hoon Choi, Seongnam-si (KR); Sung Gil Kim, Yongin-si (KR); Seulye Kim, Seoul (KR); Jung Ho Kim, Seongnam-si (KR); Hong Suk Kim, Yongin-si (KR); Phil Ouk Nam, Suwon-si (KR); Jae Young Ahn, Seongnam-si (KR); Han Jin Lim, Seoul (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/142,637

(22) Filed: Sep. 26, 2018

(65) Prior Publication Data

US 2019/0027495 A1 Jan. 24, 2019

Related U.S. Application Data

(62) Division of application No. 15/484,339, filed on Apr. 11, 2017, now Pat. No. 10,090,323.

(30) Foreign Application Priority Data

Oct. 13, 2016 (KR) .................. 10-2016-0132750

(51) Int. Cl.
*H01L 29/792* (2006.01)
*H01L 27/11582* (2017.01)
(Continued)

(52) U.S. Cl.
CPC .... *H01L 27/11582* (2013.01); *H01L 23/5283* (2013.01); *H01L 27/11565* (2013.01)

(58) Field of Classification Search
CPC ......... H01L 27/11582; H01L 27/11565; H01L 23/5283
See application file for complete search history.

(56) References Cited

U.S. PATENT DOCUMENTS 8,017,993 B2 9/2011 Kidoh et al.
8,829,595 B2 9/2014 Lee
(Continued)

FOREIGN PATENT DOCUMENTS

KR 10-2018-0009837 A 1/2018

*Primary Examiner* — Didarul A Mazumder
*Assistant Examiner* — Wasiul Haider
(74) *Attorney, Agent, or Firm* — Lee IP Law, P.C.

(57) ABSTRACT

A semiconductor device includes a stack structure on a substrate, the stack structure including interlayer insulating layers and first gate electrodes alternately stacked on each other, a semiconductor layer in an opening penetrating through the stack structure, a first dielectric layer between the semiconductor layer and the stack structure, and a lower pattern closer to the substrate than to the first gate electrodes in the stack structure, the lower pattern including a first surface facing the first dielectric layer, and a second surface facing the stack structure, the second surface defining an acute angle with the first surface, wherein the first dielectric layer includes a first portion facing the stack structure, and a second portion facing the first surface of the lower pattern, the second portion having a thickness greater than a thickness of the first portion.

12 Claims, 43 Drawing Sheets

(51) Int. Cl.
  *H01L 23/528* (2006.01)
  *H01L 27/11565* (2017.01)

(56) References Cited

U.S. PATENT DOCUMENTS

| | | |
|---|---|---|
| 9,006,884 B2 | 4/2015 | Lee et al. |
| 9,018,696 B2 | 4/2015 | Wada et al. |
| 9,123,580 B2 | 9/2015 | Lee et al. |
| 9,171,729 B2 | 10/2015 | You et al. |
| 9,184,177 B2 | 11/2015 | Imamura et al. |
| 9,252,230 B2 | 2/2016 | Ko |
| 9,299,716 B2 | 3/2016 | Hwang et al. |
| 2012/0070944 A1 | 3/2012 | Kim et al. |
| 2013/0270621 A1* | 10/2013 | Mori ............... H01L 29/78 257/314 |
| 2014/0035026 A1* | 2/2014 | Jang ............... H01L 29/792 257/324 |
| 2014/0191389 A1 | 7/2014 | Lee et al. |
| 2015/0179564 A1 | 6/2015 | Lee et al. |
| 2015/0255385 A1 | 9/2015 | Lee et al. |
| 2015/0255484 A1 | 9/2015 | Imamura et al. |
| 2015/0279856 A1 | 10/2015 | Hyun et al. |
| 2015/0287710 A1 | 10/2015 | Yun et al. |
| 2015/0318300 A1 | 11/2015 | Ohsaki |
| 2015/0371709 A1 | 12/2015 | Kai et al. |
| 2016/0005759 A1 | 1/2016 | Kim et al. |
| 2016/0155750 A1 | 6/2016 | Yasuda |
| 2016/0172366 A1 | 6/2016 | Koka et al. |
| 2018/0026046 A1 | 1/2018 | Nam et al. |

\* cited by examiner

SEMICONDUCTOR DEVICE INCLUDING DIELECTRIC LAYER

CROSS-REFERENCE TO RELATED APPLICATIONS

This is a divisional application based on pending application Ser. No. 15/484,339, filed Apr. 11, 2017, the entire contents of which is hereby incorporated by reference.

Korean Patent Application No. 10-2016-0132750 filed on Oct. 13, 2016 in the Korean Intellectual Property Office, and entitled: "Semiconductor Device Including Dielectric Layer," is incorporated by reference herein in its entirety.

BACKGROUND

1. Field

The present disclosure relates to a semiconductor device including a dielectric layer and a method of manufacturing the same.

2. Description of the Related Art

In order to improve the integration of semiconductor devices, NAND flash devices, including word lines arranged in a direction perpendicular to an upper surface of a substrate, and dielectric layers and channel layers disposed in holes passing through the word lines, have been developed.

SUMMARY

According to an aspect of the present disclosure, a semiconductor device is provided. The semiconductor device includes a stack structure disposed on a substrate. The stack structure includes interlayer insulating layers and first gate electrodes alternately stacked on each other. A semiconductor layer is disposed in an opening penetrating through the interlayer insulating layers and the first gate electrodes. A first dielectric layer is interposed between the semiconductor layer and the stack structure. A lower pattern is disposed to be closer to the substrate than to the first gate electrodes. The lower pattern includes a first surface facing the first dielectric layer, and a second surface facing the stack structure while forming an acute angle with the first surface. The first dielectric layer includes a first portion facing the stack structure, and a second portion facing the first surface of the lower pattern and having a thickness greater than a thickness of the first portion.

According to an aspect of the present disclosure, a semiconductor device is provided. The semiconductor device includes a stack structure disposed on a substrate. The stack structure includes interlayer insulating layers and word lines alternately stacked on each other. A semiconductor layer penetrating through the word lines and the interlayer insulating layers is provided. A first dielectric layer including a first portion interposed between the semiconductor layer and the stack structure, and a second portion bent from the first portion and having a thickness greater than a thickness of the first portion is provided. A lower pattern disposed to be closer to the substrate than to the word lines, while being located on the substrate, is provided.

According to an aspect of the present disclosure, a semiconductor device is provided. The semiconductor device includes a stack structure disposed on a substrate. The stack structure includes interlayer insulating layers and word lines alternately stacked on each other. A hole penetrating through the stack structure is provided. A vertical structure is disposed in the hole. The vertical structure includes a semiconductor layer disposed in the hole, a first dielectric layer between the semiconductor layer and the stack structure, and a pad contacting an upper region of the semiconductor layer. A lower pattern is disposed to be closer to the substrate than to the word lines. The first dielectric layer includes a first portion facing the stack structure, and a second portion facing the lower pattern and having a thickness greater than a thickness of the first portion.

According to an aspect of the present disclosure, a semiconductor device is provided. The semiconductor device includes a stack structure on a substrate, the stack structure including interlayer insulating layers and first gate electrodes alternately stacked on each other, a semiconductor layer in an opening penetrating through the stack structure, a first dielectric layer between the semiconductor layer and the stack structure, the first dielectric layer including a first portion along a sidewall of the stack structure, and a second portion bent from the first portion and having a thickness greater than a thickness of the first portion, and a lower pattern in the opening and in contact with a bottom of the second portion of the first dielectric layer.

BRIEF DESCRIPTION OF DRAWINGS

Features will become apparent to those of ordinary skill in the art by describing in detail exemplary embodiments with reference to the attached drawings, in which.

DETAILED DESCRIPTION

Figure 1:
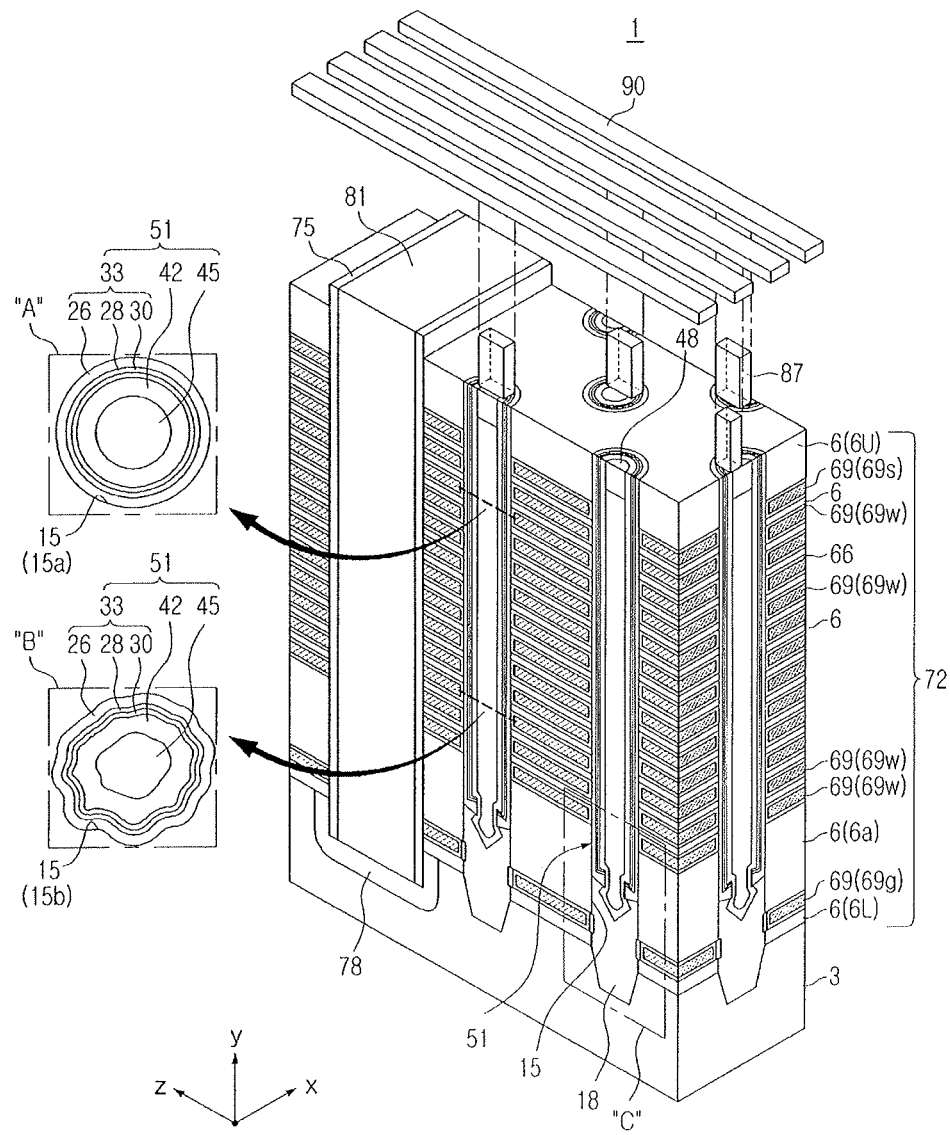
FIG. 1 illustrates a perspective view of a semiconductor device according to an example embodiment.

FIG. 1 is a perspective view of a semiconductor device 1 according to an example embodiment. Portions "A" and "B" in FIG. 1 are enlarged plan views illustrating portions of an opening 15 and a vertical structure 51 in the perspective view of FIG. 1.

Referring to FIG. 1, the semiconductor device 1 according to an example embodiment may include a substrate 3, a stack structure 72 on the substrate 3, the opening 15 penetrating through the stack structure 72, the vertical structure 51 in the opening 15, and a lower pattern 18 in contact with at least a portion of the vertical structure 51.

The substrate 3 may be a semiconductor substrate formed of a semiconductor material, e.g., silicon or the like. The stack structure 72 may include interlayer insulating layers 6 and gate electrodes 69 alternately stacked on the substrate 3. The gate electrodes 69 may be formed of a metal nitride, e.g., TiN, and/or a metal, e.g., tungsten (W). The interlayer insulating layers 6 may be formed of, e.g., a silicon oxide.

The gate electrodes 69 may include first gate electrodes 69w, a second gate electrode 69g below the first gate electrodes 69w, and a third gate electrode 69s on the first gate electrodes 69w. The gate electrodes 69 may be gate electrodes of a nonvolatile memory device, e.g., a NAND flash memory device. For example, the second gate electrode 69g may be a ground selection gate electrode, the third gate electrode 69s may be a string selection gate electrode, and the first gate electrodes 69w between the second and third gate electrodes 69g and 69s may include word lines. For convenience of description, in descriptions provided below, the first gate electrodes 69w are referred to as word lines 69w, the second gate electrode 69g is referred to as a ground selection gate electrode 69g, and the third gate electrode 69s is referred to as a string selection gate electrode 69s.

The interlayer insulating layers 6 may include a lowermost interlayer insulating layer 6L and an uppermost interlayer insulating layer 6U. The lowest interlayer insulating layer 6L may be interposed between the ground selection gate electrode 69g and the substrate 3. The uppermost interlayer insulating layer 6U may cover the string selection gate electrode 69s.

In example embodiments, an interlayer insulating layer interposed between a lowermost word line 69w among the word lines 69w and the ground selection gate electrode 69g, among the interlayer insulating layers 6, may be referred to as a lower interlayer insulating layer 6a. The lower interlayer insulating layer 6a may have a thickness greater than a thickness of each of the interlayer insulating layers 6 interposed between the word lines 69w.

The opening 15 may penetrate through the stack structure 72 to allow a portion of the substrate 3 to be exposed. The opening 15 may extend into the substrate 3 while penetrating through the stack structure 72.

The lower pattern 18 may be disposed in the opening 15. The vertical structure 51 on the lower pattern 18 and the lower pattern 18 may fill the opening 15. The opening 15 may be a hole. The lower pattern 18 may be in contact with the portion of the substrate 3 exposed by the opening 15. The lower pattern 18 may be disposed to be lower than positions of the word lines 69w. The lower pattern 18 may be disposed to be closer to the substrate 3 than the word lines 69w. The lower pattern 18 may have a side facing the ground selection gate electrode 69g. The lower pattern 18 may be formed of a semiconductor material or a silicon material. The lower pattern 18 may be formed of an epitaxial material layer grown from the substrate 3 exposed by the opening 15. The epitaxial material layer may include a monocrystalline silicon material.

The vertical structure 51 may be formed on the lower pattern 18 in the opening 15. The vertical structure 51 may include a core pattern 45, a pad 48, a semiconductor layer 42, and a dielectric structure 33. The core pattern 45, the semiconductor layer 42 and the dielectric structure 33 may penetrate through the word lines 69w and through the interlayer insulating layers 6 between the word lines 69w. The pad 48 may be disposed to be higher than the string selection gate electrode 69s, e.g., the pad 48 may be on the top of the core pattern 45. The semiconductor layer 42 may rover a side surface and a bottom surface of the core pattern 45. The core pattern 45 and the semiconductor layer 42 may penetrate through the string selection gate electrode 69s and the word lines 69w. The semiconductor layer 42 may face the string select gate electrode 69s and the word lines 69w. The semiconductor layer 42 may be referred to as a channel layer.

The semiconductor layer 42 may be configured of a silicon layer. The core pattern 45 may be formed of an insulating material, e.g., silicon oxide or the like. The pad 48 may be disposed on the core pattern 45. The semiconductor layer 42 may extend onto a side of the pad 48. The pad 48 may be formed of, e.g., doped polysilicon. For example, the pad 48 may be formed of an N-type conductivity polysilicon. The pad 48 may be a drain of a transistor.

The dielectric structure 33 may be interposed between the semiconductor layer 42 and the stack structure 72. The dielectric structure 33 may include a first dielectric layer 26, a second dielectric layer 28, and a third dielectric layer 30. The second dielectric layer 28 may be interposed between the first dielectric layer 26 and the third dielectric layer 30. The third dielectric layer 30 may be interposed between the second dielectric layer 28 and the semiconductor layer 42.

The third dielectric layer 30 may be a tunnel dielectric. The third dielectric layer 30 may include, e.g., a silicon oxide and/or a nitrogen-doped silicon oxide. The second dielectric layer 28 may be a layer storing information therein in a non-volatile memory device, e.g., in a flash memory device or the like. For example, the second dielectric layer 28 may be formed of e.g., a silicon nitride, capable of trapping and retaining electrons injected from the semiconductor layer 42 through the third dielectric layer 30, or of removing the trapped electrons within the second dielectric layer 28, depending on operating conditions of the non-volatile memory device, e.g., a flash memory device or the like. The first dielectric layer 26 may be formed of, e.g., a silicon oxide. Alternatively, the first dielectric layer 26 may be formed of a silicon oxide containing an impurity, e.g., carbon (C), boron (B), phosphorus (P), or the like.

The stack structure 72 may further include fourth dielectric layers 66. The fourth dielectric layers 66 may be interposed between the gate electrodes 69 and the interlayer insulating layers 6 to cover sides of the gate electrodes 69 facing the holes 15. The fourth dielectric layers 66 may be formed of a high dielectric material, e.g., AlO or the like. The fourth dielectric layers 66 may form a blocking dielectric layer, together with the first dielectric layer 26.

Figure 3A:
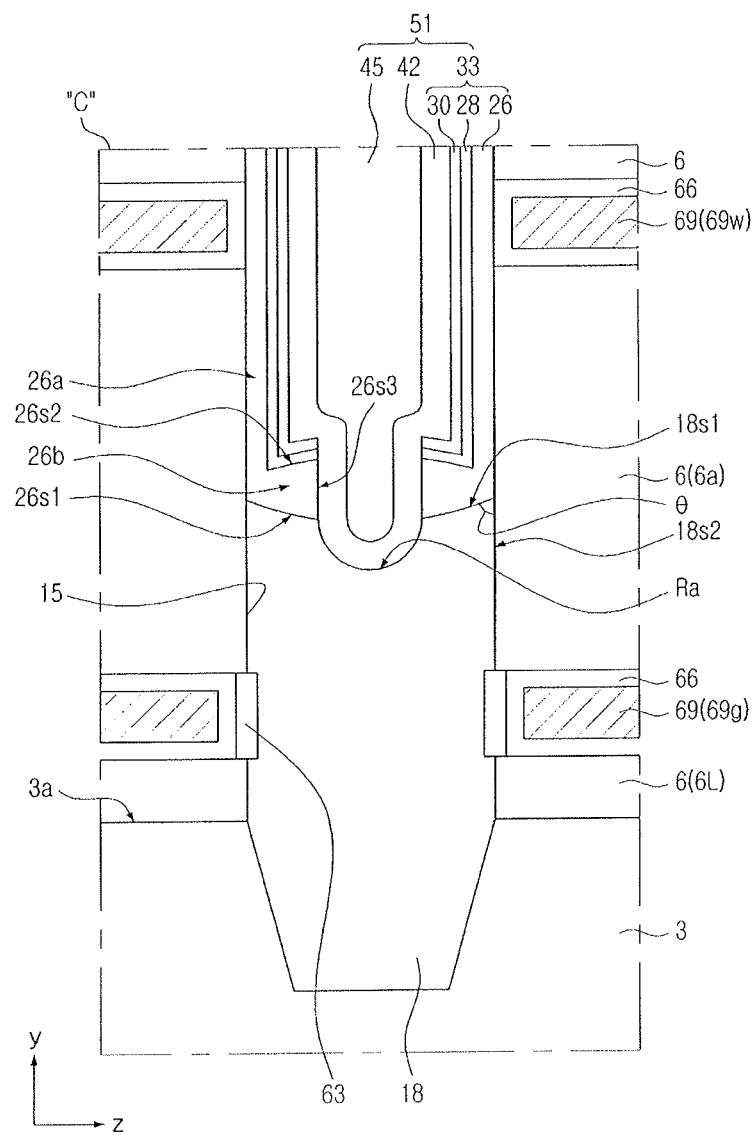
FIGS. 3A to 3C and FIG. 4 illustrate partially enlarged views of portion "C" of FIG. 1 to illustrate modifications of a semiconductor device according to an example embodiment.

The semiconductor device 1 according to an example embodiment may further include an oxide layer 63 interposed between the ground selection gate electrode 69g and the lower pattern 18 (FIG. 3A). The oxide layer 63 may be in contact with the lower pattern 18.

The semiconductor device 1 according to an example embodiment may further include a separation pattern 81, a spacer 75, and an impurity region 78. The separation pattern 81 penetrating through the stack structure 72 may be formed. The spacer 75 may be interposed between the separation pattern 81 and the stack structure 72. The separation pattern 81 may be formed of a conductive material, e.g., tungsten (W). The spacer 75 may be formed of an insulating material, e.g., a silicon oxide, a silicon nitride and/or the like. The impurity region 78 may be disposed in the substrate 3 to be located below the separation pattern 81. The impurity region 78 may have N-type conductivity. The impurity region 78 may be a common source region.

The semiconductor device 1 according to an example embodiment may further include a contact plug 87 on the vertical structure 51, and a bit line 90 on the contact plug 87. The contact plug 87 may be electrically connected to the pad 48. The contact plug 87 and the bit line 90 may be formed of a conductive metal. The hit line 90 may be disposed to be higher than a position of the separation pattern 81 and may be spaced apart from the separation pattern 81.

The opening 15 may include a first hole region 15a and a second hole region 15b. The first hole region 15a may be located on, e.g., above, the second hole region 15b, e.g., the first and second hole regions 15a and 15b may be vertically above each other and in fluid communication with each other to define a single opening through an entire stack 72. The first hole region 15a may be relatively close to the third gate electrode 69s, i.e., to the string selection gate electrode, and the second hole region 15b may be relatively close to the second gate electrode 69g, i.e., to the ground selection gate electrode. In other words, as illustrated in FIG. 1, the first hole region 15a (e.g., the top dashed line across the opening 15 in FIG. 1) may be higher than the second hole region 15b (e.g., the bottom dashed line across the opening 15 in FIG. 1) relatively to the substrate 3.

As illustrated in the enlarged portions of FIG. 1, the first hole region 15a may have a shape closer to a circular shape than a shape of the second hole region 15b thereto. For example, a portion of the opening 15 that is close to the string selection gate electrode 69s, e.g., close to the top of the stack 72, may have a substantially and uniformly rounded, e.g., circular, shape in a top view.

As further illustrated in the enlarged portions of FIG. 1, the second hole region 15b may have a shape of a deformed or distorted circular shape. For example, a portion of the opening 15 that is close to the ground selection gate electrode 69g, e.g., close to the bottom of the stack 72, may have an irregularly curved shape, e.g., a distorted or deformed circular shape in a top view. For example, the second hole region 15b may have a shape including both a concave portion and a convex portion when viewed in a top view. For example, the second hole region 15b may have a deformed or distorted circular cross-sectional shape including repeated concave and convex portions, and the like.

In an example embodiment, as illustrated in FIG. 1, the first dielectric layer 26 formed in the distorted second hole region 15b may be formed to have a uniform width, as viewed in a top view. However, example embodiments of the present disclosure are not limited thereto. For example, the first dielectric layer 26 in the second hole region 15b may be formed to have a non-uniform width. A modified example of the first dielectric layer 26 in the second hole region 15b will be described with reference to FIG. 2.

Figure 2:
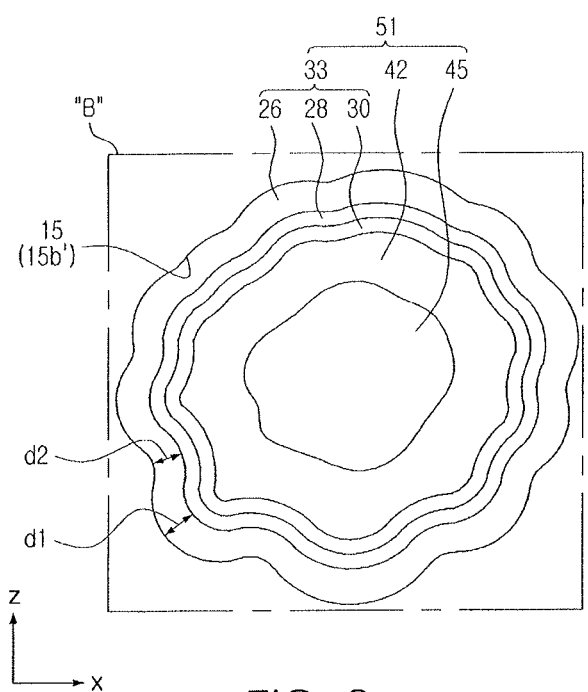
FIG. 2 illustrates a partially enlarged view of a modified example of the semiconductor device of FIG. 1 according to an example embodiment.

Referring to FIG. 2, in a second hole region 15b', which is on the same plane, i.e., at a same height relative to the substrate 3, the first dielectric layer 26 may include first and second thickness portions d1 and d2 having different widths along a radial direction. For example, as illustrated in FIG. 2, in the case of the first dielectric layer 26 on a same plane, the first thickness portion d1 may have a width greater than that of the second thickness portion d2. The first thickness portion d1 may be formed in a concave region of the second hole region 15b', and the second thickness portion d2 may be formed in a convex region of the second hole region 15b'. In this case, the convex region of the second hole region 15b' (corresponds to the second thickness portion d2) refers to a portion of the sidewall of the second hole region 15b' that bulges inwardly toward a center of the opening 15, and the concave region of the second hole region 15b' (corresponds to the first thickness portion d1) refers to a portion of the sidewall of the second hole region 15b' that extends outwardly away from the center of the second hole region 15b'.

As illustrated in FIG. 2, the first dielectric layer 26 may be, e.g., directly, on the sidewall of the second hole region 15b, and may trace the outline of the convex and concave portions of the second hole region 15b. The first dielectric layer 26 as described above may improve reliability of the semiconductor device. In addition, the first dielectric layer 26 may improve cell distribution characteristics in the semiconductor device.

Referring back to FIG. 1, the dielectric structure 33 may include bent portions. The dielectric structure 33 including the bent portions will be described with reference to FIG. 3A. FIG. 3A is a partially enlarged view illustrating portion "C" of FIG. 1.

With reference to FIGS. 1 and 3A, the dielectric structure 33 may include portions extending in a direction perpendicular to an upper surface 3a of the substrate 3 and portions extending in a direction parallel to the upper surface 3a of the substrate 3. Ends of the bent portions of the dielectric structure 33 may contact the semiconductor layer 42. The bent portions of the dielectric structure 33 may be disposed to be higher than the ground selection gate electrode 69g while being located below the word lines 69w.

The first dielectric layer 26 may include a first portion 26a and a second portion 26b. The first portion 26a of the first dielectric layer 26 may be a portion facing a side wall of the opening 15, and the second portion 26b of the first dielectric layer 26 may be a portion facing the lower pattern 18.

The first portion 26a of the first dielectric layer 26 may have a linear form extending in a direction perpendicular to an upper surface of the substrate 3, and the second portion 26b of the first dielectric layer 26 may extend from the first portion 26a in a direction parallel to the upper surface of the substrate 3. The second portion 26b of the first dielectric layer 26 may be continuously formed from the first portion 26a.

The second portion 26b of the first dielectric layer 26 may have a thickness, e.g., along the y-axis, greater than a thickness of the first portion 26a, e.g., along the z-axis. A thickness of the second portion 26b may be increased as a distance, e.g., along the z axis, from a side wall of the opening 15 increases. In an example, in the case of the first dielectric layer 26, the second portion 26b may have a thickness that is about 1.5 or more times greater than that of the first portion 26a. For example, the thickness of the second portion 26b may be about 1.5 to about 5 times greater than that of the first portion 26a, e.g., the thickness of the second portion 26b may be about 2 to about 5 times greater than that of the first portion 26a or about 2 to about 3 times greater than that of the first portion 26a.

The second portion 26b of the first dielectric layer 26 may include a first surface 26s1 and a second surface 26s2. The first surface 26s1 of the second portion 26b may be a bottom surface in contact with the lower pattern 18. The second surface 26s2 of the second portion 26b may be an upper surface thereof in contact with the second dielectric layer 28. The second portion 26b of the first dielectric layer 26 may have a third surface 26s3 in contact with the semiconductor layer 42.

The first surface 26s1 of the second portion 26b of the first dielectric layer 26 may form an obtuse angle with respect to the first portion 26a, i.e., relative to the y-axis. The second surface 26s2 of the second portion 26b of the first dielectric layer 26 may form an acute angle with respect to the first portion 26a, i.e., relative to the y-axis. The second and third dielectric layers 28 and 30 may be bent to have acute angles on the second portion 26b of the first dielectric layer 26.

The lower pattern 18 may have a first surface 18s1 and a second surface 18s2. The first surface 18s1 of the lower pattern 18 may be in contact with the second portion 26b of the first dielectric layer 26. The second surface 18s2 of the lower pattern 18 may be substantially perpendicular to the upper surface 3a of the substrate 3a. The first surface 18s1 of the lower pattern 18 may be an upper surface thereof, and the second surface 18s2 of the lower pattern 18 may be a side surface thereof.

An angle (θ) between the second surface 18s2 of the lower pattern 18 and the first surface 18s1 of the lower pattern 18 may be less than 90 degrees. Thus, the second surface 18s2 of the lower pattern 18 may form an acute angle with the first surface 18s1 of the lower pattern 18.

The lower pattern 18 may include a recessed portion Ra recessed from a central portion of an upper surface thereof. The recessed portion Ra of the lower pattern 18 may be in contact with the semiconductor layer 42.

In an example, the recessed portion Ra of the lower pattern 18 may be downwardly concave from the upper surface of the lower pattern 18. The recessed portion Ra of the lower pattern 18 may have a rounded shape in a vertical direction, but is not limited thereto. A modified example of the shape of the recessed portion Ra will be described with reference to FIG. 3B.

Figure 3B:
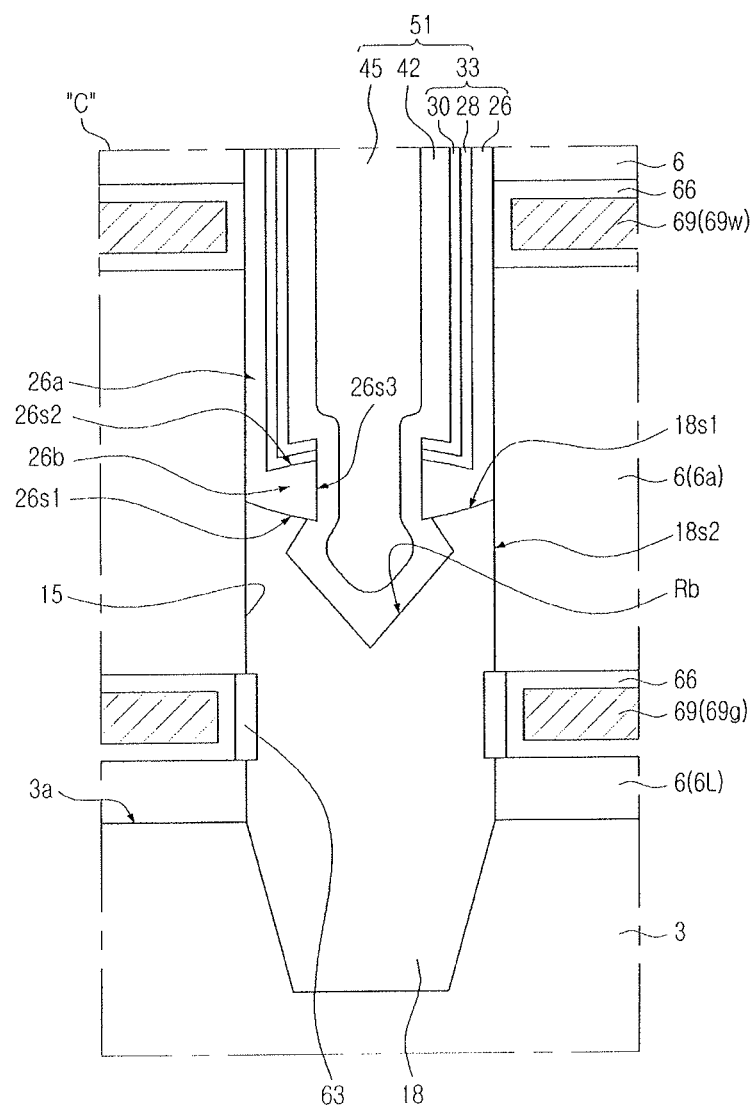

Referring to FIG. 3B, the lower pattern 18 may include a recessed portion Rb recessed downwardly from an upper surface thereof to have a sigma shape, e.g., a partial diamond shape having one vertex at a lowest point of the recessed portion Rb and two additional vertices facing each other and at a higher point than the lowest point. For example, the recessed portion Rb may have a form of which a width is gradually increased and then gradually reduced, in a direction from an upper portion to a lower portion thereof. The recessed portion Rb may be disposed to be higher than the ground selection gate electrode 69g, but is not limited thereto. A modified example of the recessed portion Rb will be described with reference to FIG. 3C.

Figure 3C:
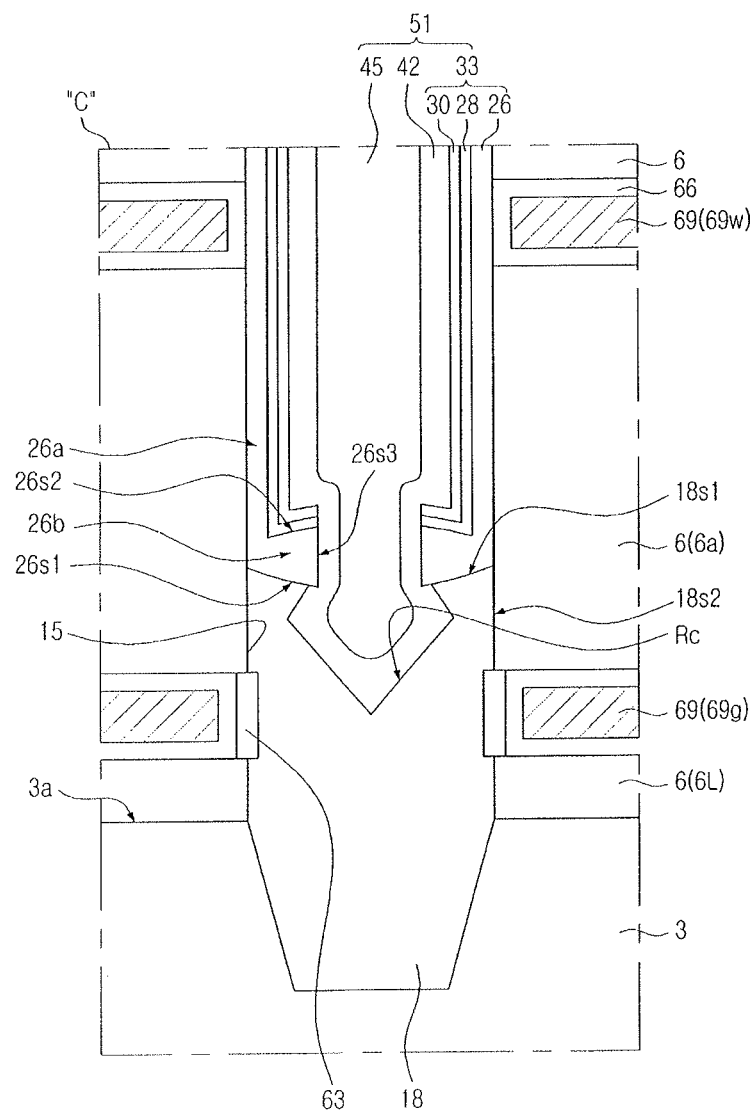

Referring to FIG. 3C, in the case of the lower pattern 18 including a recessed portion Rc recessed downwardly from an upper surface thereof to have a sigma shape, a lowermost portion of the recessed portion Rc may be located in a portion of the opening 15 penetrating through the ground selection gate electrode 69g. The lowermost portion of the recessed portion Rc of the lower pattern 18 may be located on a level lower than an upper surface of the ground selection gate electrode 69g while being higher than a bottom surface of the ground selection gate electrode 69g.

Figure 4:
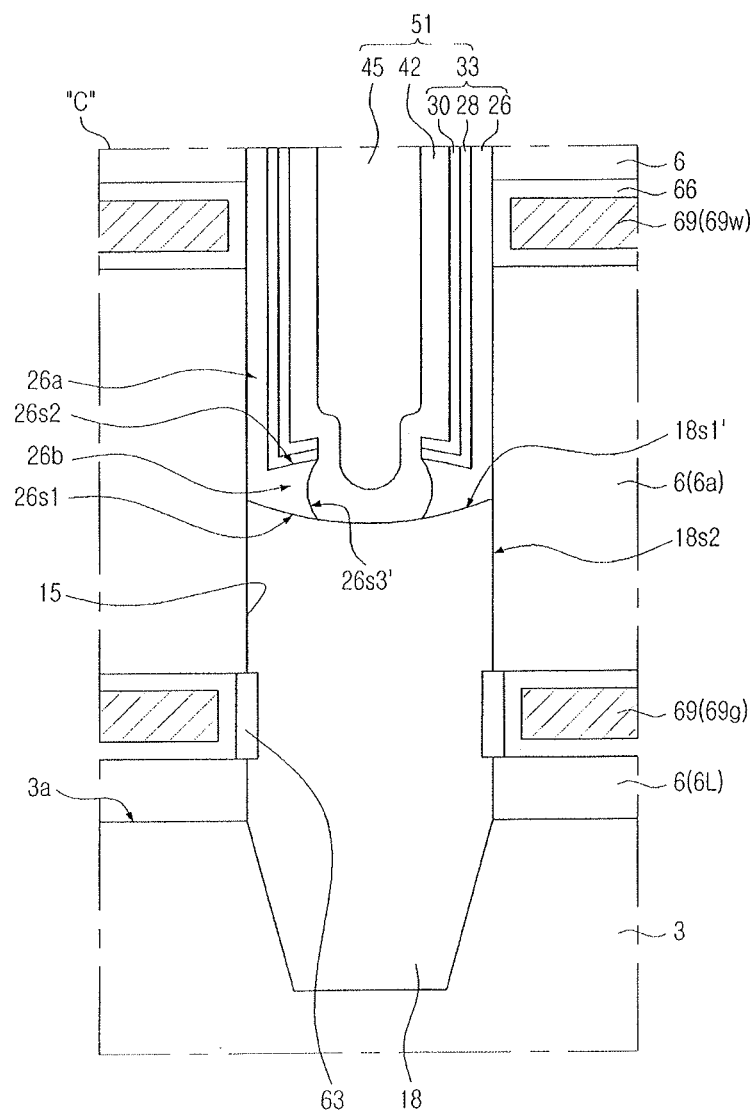

In FIGS. 3A, 3B and 3C, the second portion 26b of the first dielectric layer 26 may have the third surface 26s3 in contact with the semiconductor layer 42. The third surface 26s3 may be substantially perpendicular to the upper surface of the substrate 3. However, example embodiments of the present disclosure are not limited thereto. A modified example of the third surface 26s3 will be described with reference to FIG. 4. Referring to FIG. 4, in the case of the second portion 26b of the first dielectric layer 26, a third surface 26s3' in contact with the semiconductor layer 18 may be concave. In an example embodiment, an upper surface 18s1' of the lower pattern 18 may be concave.

Figure 5A:
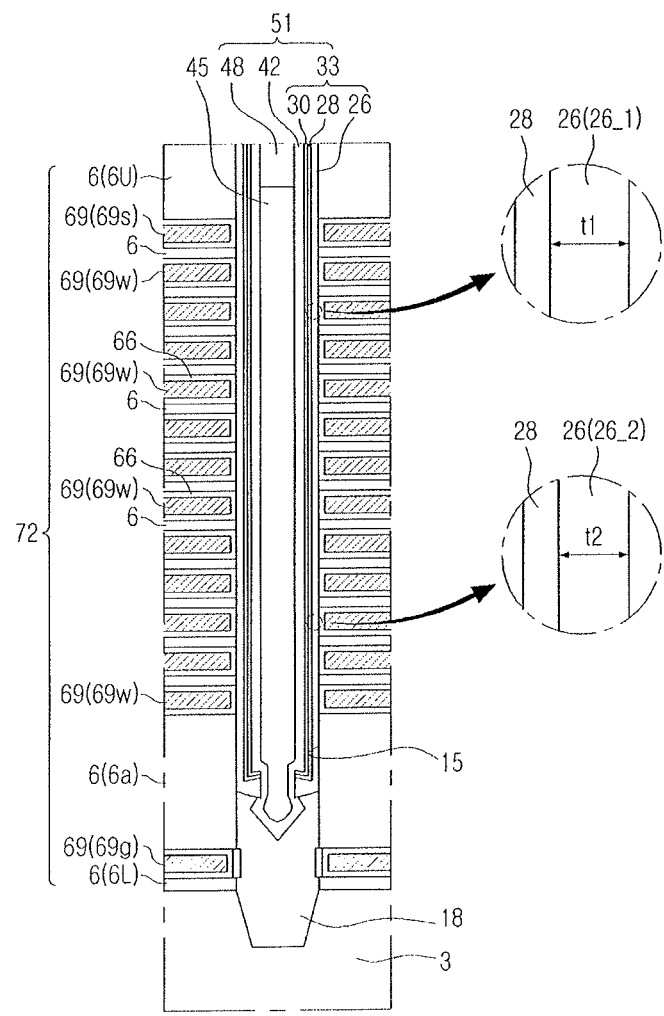
FIG. 5A illustrates a cross-sectional view of an example of a semiconductor device according to an example embodiment.

Referring to FIGS. 1 and 5A, examples of the dielectric structure 33 will be described below.

Referring to FIG. 5A together with FIG. 1, in the case of the dielectric structure 33, the first dielectric layer 26 may include a lower region 26_2 and an upper region 26_1 on the lower region 26_2. In the first dielectric layer 26, the lower region 26_2 and the upper region 26_1 may face a sidewall of the hole 15.

Figure 5B:
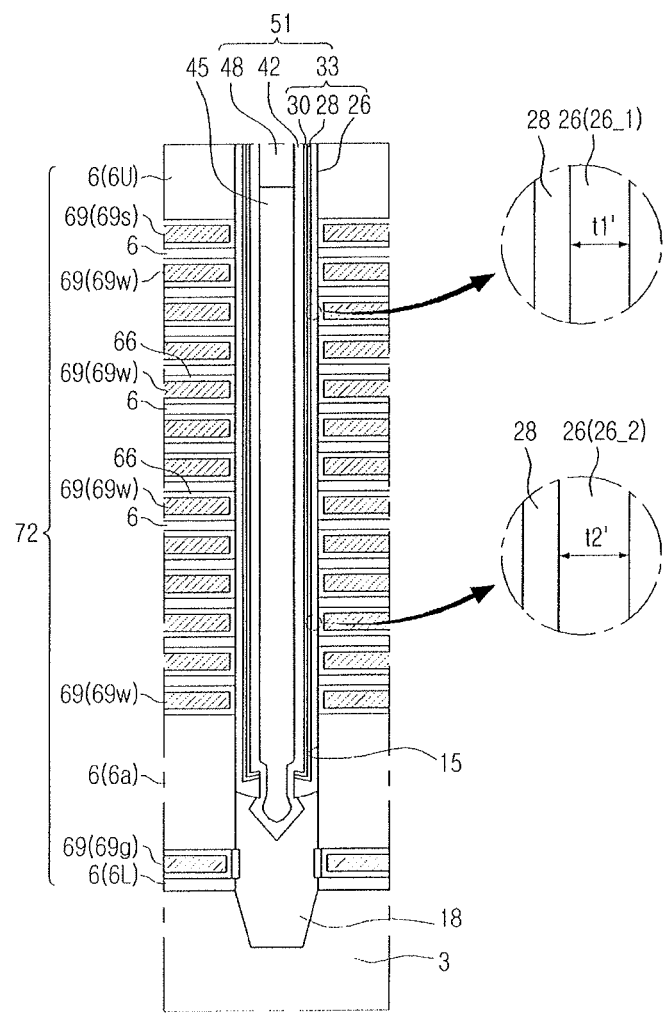
FIG. 5B illustrates a cross-sectional view of a modified example of the semiconductor device according to an example embodiment.

In the case of the dielectric structure 33, a thickness t1 of the upper region 26_1 of the first dielectric layer 26 may be equal to a thickness t2 of the lower region 26_2 of the first dielectric layer 26, or may be greater than the thickness t2 of the lower region 26_2 of the first dielectric layer 26. However, example embodiments of the present disclosure are not limited thereto. A modified example of the thickness of the first dielectric layer 26 will be described with reference to FIG. 5B. Referring to FIG. 5B, a thickness t1' of the upper region 26_1 of the first dielectric layer 26 may be less than a thickness t2' of the lower region 26_2 of the first dielectric layer 26.

Figure 6:
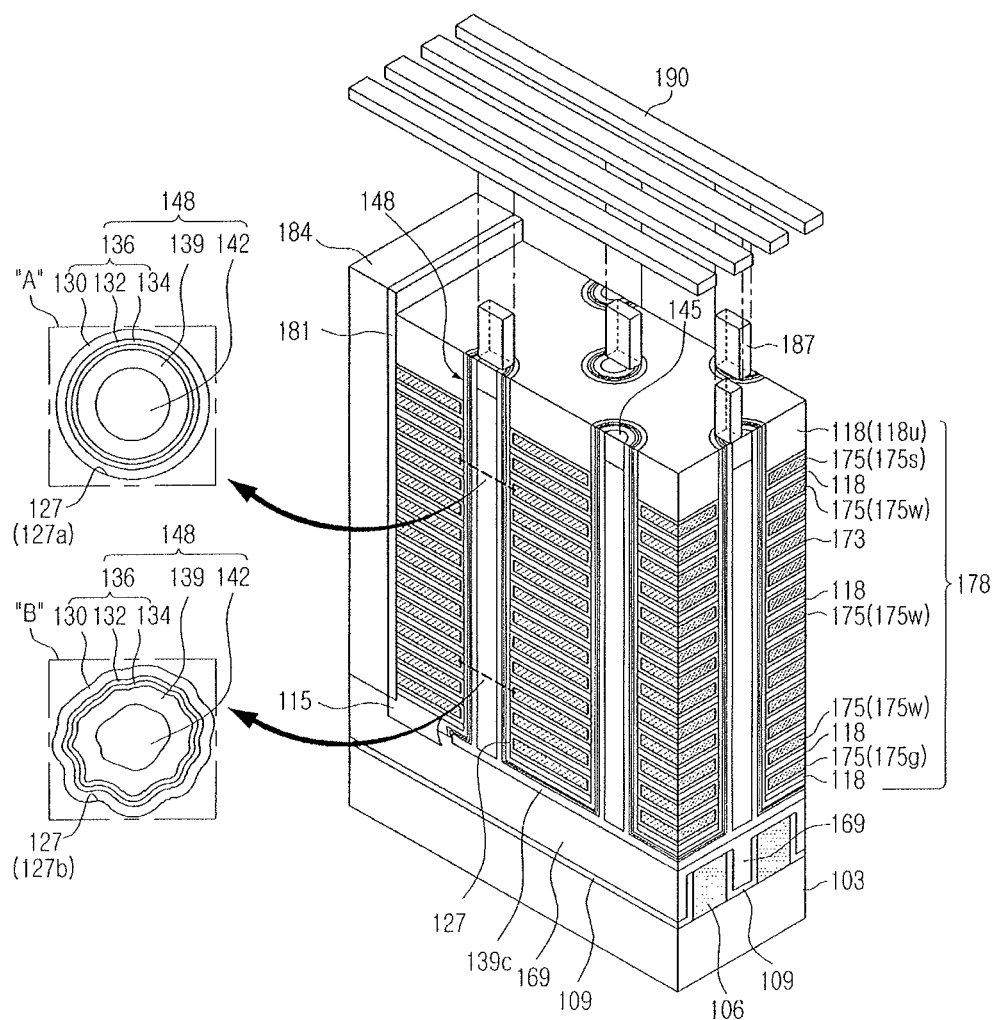
FIG. 6 is illustrates a perspective view of a semiconductor device according to another example embodiment.
Figure 7A:
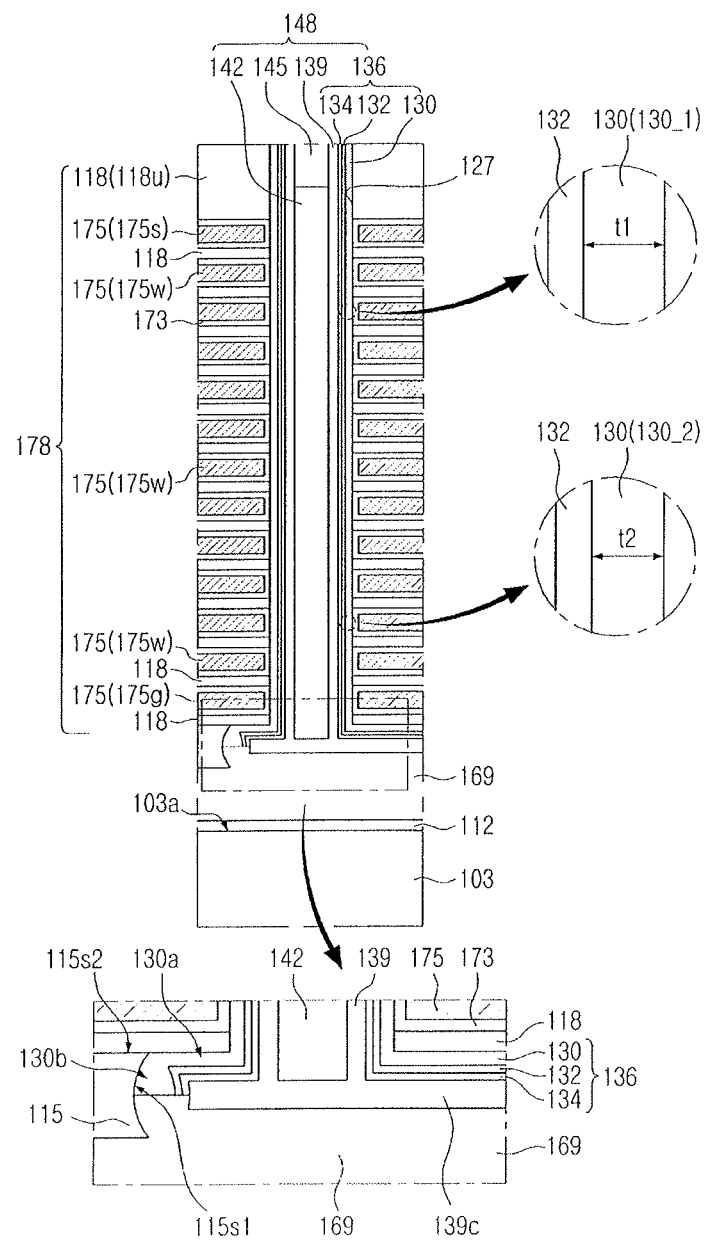
FIG. 7A illustrates a cross-sectional view of an example of the semiconductor device according to another example embodiment.
Figure 7B:
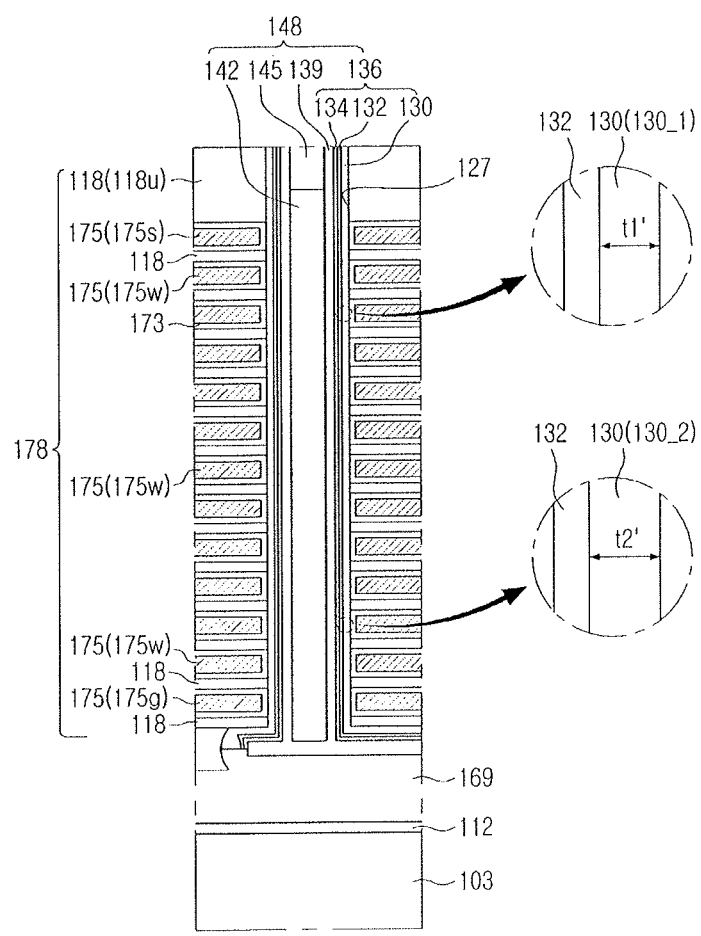
FIG. 7B illustrates a cross-sectional view of a modified example of the semiconductor device according to another example embodiment.

Next, a semiconductor device according to another example embodiment will be described with reference to FIG. 6. FIG. 6 is a perspective view of a semiconductor device according to another example embodiment. Portions "A" and "B" in FIG. 6 may be portions corresponding to portions "A" and "B" illustrated in FIG. 1, and are enlarged plan views illustrating portions of an opening 127 and a vertical structure 148. FIG. 7A is an enlarged cross-sectional view illustrating a portion of the perspective view of FIG. 6 to illustrate an example of constituent elements of a semiconductor device according to another example embodiment. FIG. 7B is an enlarged cross-sectional view illustrating a portion of the perspective view of FIG. 6 to illustrate a modified example of constituent elements of a semiconductor device according to another example embodiment.

Referring to FIGS. 6 and 7A, a semiconductor device 100 according to another example embodiment may include first and second patterns 106 and 109 interposed between a substrate 103 and a stack structure 178, and a connection pattern 169.

The substrate 103 may be a semiconductor substrate formed of a semiconductor material, e.g., silicon or the like. The first patterns 106 may be formed to have a column shape on the substrate 103. The first patterns 106 may be formed of an insulating material, e.g., a silicon oxide.

The second patterns 109 may cover the substrate 103 in the vicinity of the first patterns 106 while covering sidewalls of the first patterns 106. The second patterns 109 may be formed of a semiconductor material or a silicon material. For example, the second pattern 109 may be formed of impurity-doped polysilicon. For example, the second pattern 109 may be formed of carbon-doped polysilicon. The connection pattern 169 may be disposed on the second patterns 109, may fill a gap between the first patterns 106, and may cover the first and second patterns 106 and 109. The connection pattern 169 may be formed of a semiconductor material or a silicon material. For example, the connection pattern 169 may be formed of polysilicon.

The semiconductor device 100 according to the example embodiment may include the stack structure 178 above the substrate 103, the openings 127 penetrating through the stack structure 178, vertical structures 148 in the openings 127, and a lower pattern 115 disposed below the stack structure 178 while being disposed above the substrate 103.

The stack structure 178 may be disposed on the connection pattern 169. The stack structure 178 may include interlayer insulating layers 118 and gate electrodes 175 alternately stacked on each other. The gate electrodes 175 may include first gate electrodes 175w, a second gate electrode 175g below the first gate electrodes 175w, and a third gate electrode 175s on the first gate electrodes 175w. The first gate electrodes 175w may include word lines, the second gate electrode 175g may be a ground selection gate electrode, and the third gate electrode 175s may be a string selection gate electrode.

Each of the vertical structures 148 may include a core pattern 142, a pad 145 on the core pattern 142, a semiconductor layer 139 covering sidewalls and a bottom surface of the core pattern 142, and a dielectric structure 136 between the semiconductor layer 139 and the stack structure 178. The core pattern 142, the semiconductor layer 139, and the dielectric structure 136 may penetrate through the gate electrodes 175, and the interlayer insulating layers 118 between the gate electrodes 175. The core pattern 142, the pad 145, the semiconductor layer 139 and the dielectric structure 136 may be formed of the same material as the core pattern 45, the pad 48, the semiconductor layer 42, and the dielectric structure 33 illustrated above with reference to FIG. 1.

The openings 127 may include a plurality of holes. Each of the openings 127 may include a first hole region 127a and a second hole region 127b. The first hole region 127a may be located on the second hole region 127b, and may have a shape closer to a circular shape than a shape of the second hole region 127b thereto. The second hole region 127b may have a shape including both a concave portion and a convex portion.

The semiconductor layer 139 in one of the openings 127 may extend below the stack structure 178 to be connected to the semiconductor layer 139 in another opening adjacent thereto. As such, the semiconductor layer extending below the stack structure 178 may be referred to as a semiconductor connection layer 139c. Thus, the semiconductor connection layer 139c may be disposed below the stack structure 178, and may connect the semiconductor layers 139 within adjacent openings 12 to each other. The semiconductor connection layer 139c may be in contact with the connection pattern 169. The connection pattern 169 may contact a bottom surface of the semiconductor connection layer 139c and a portion of the semiconductor connection layer 139c.

The dielectric structure 136 may be disposed within the openings 127, and may extend between the semiconductor connection layer 139c and the stack structure 178. The dielectric structure 136 may include a first dielectric layer 130, a second dielectric layer 132, and a third dielectric layer 134. The second dielectric layer 132 may be interposed between the first dielectric layer 130 and the third dielectric layer 134. The third dielectric layer 134 may be interposed between the second dielectric layer 132 and the semiconductor layer 139. The first to third dielectric layers 130, 132 and 134 may be formed of the same material as the first to third dielectric layers 26, 28 and 30 described above with reference to FIG. 1.

The stack structure 178 may further include fourth dielectric layers 173 interposed between the gate electrodes 175 and the interlayer insulating layers 118 and extending between the hole 127 and the gate electrodes 175.

The lower pattern 115 may be interposed between the stack structure 178 and the connection pattern 169. The lower pattern 115 may be spaced apart from the semiconductor connection layer 139c. The lower pattern 115 may not overlap the openings 127 and the semiconductor connection layer 139c. The lower pattern 115 may be formed of a semiconductor material or a silicon material. For example, the lower pattern 115 may be formed of an impurity-doped polysilicon material. Further, for example, the lower pattern 115 may be formed of a carbon-doped polysilicon material. The lower pattern 115 may include a first surface 115s1 and a second surface 115s2. The second surface 115s2 of the lower pattern 115 may be parallel to an upper surface 3a of the substrate 103. The first surface 115s1 of the lower pattern 115 may have a concave shape. The first surface 115s1 of the lower pattern 115 may form an acute angle with respect to the second surface 115s2.

The dielectric structure 136 may extend between the stack structure 178 and the semiconductor connection layer 139c below the stack structure 178. In addition, the dielectric structure 136 may extend between the semiconductor connection layer 139c and the lower pattern 115. The first dielectric layer 130 may include a first portion 130a extending along an inner side of the respective opening 127 to be extendedly provided below the stack structure 178, and a second portion 130b extending between the lower pattern 115 and the semiconductor connection layer 139c. The second portion 130b of the first dielectric layer 130 may have a thickness greater than that of the first portion 130a of the first dielectric layer 130. The second portion 130b of the first dielectric layer 130 may contact a portion of the first surface 115s1 of the lower pattern 115.

The connection pattern 169 may contact a portion of the first surface 115s1 of the lower pattern 115, a portion of the semiconductor connection layer 139c, and the dielectric structure 136 between the first surface 115s1 of the lower pattern 115 and the semiconductor connection layer 139c.

The semiconductor device 100 according to the example embodiment may further include a separation pattern 184 traversing the stack structure 178 to penetrate through the stack structure 178, and an insulating spacer 181 between the separation pattern 184 and the stack structures 178. The separation pattern 184 may be disposed on the connection pattern 169. The separation pattern 184 may be formed of a conductive material, such as a metal, e.g., tungsten (W) or the like, doped polysilicon, and/or the like. The lower pattern 115 may be disposed below the stack structure 178 adjacent to the separation pattern 184.

Further, the semiconductor device 100 according to the example embodiment may further include contact plugs 187 on the vertical structures 148, and bit lines 190 on the contact plugs 187.

In an example embodiment, a thickness t1 of an upper region 130_1 of the first dielectric layer 130 in the opening 127 may be equal to a thickness t2 of a lower region 130_2 of the first dielectric layer 130, or may be greater than the thickness t2 of the lower region 130_2 of the first dielectric layer 130. However, example embodiments of the present disclosure are not limited thereto. A modified example of the thickness of the first dielectric layer 130 will be described with reference to FIG. 7B. Referring to FIG. 7B, a thickness t1' of the upper region 130_1 of the first dielectric layer 130 may be less than a thickness t2' of the lower region 130_2 of the first dielectric layer 130.

Figure 8:
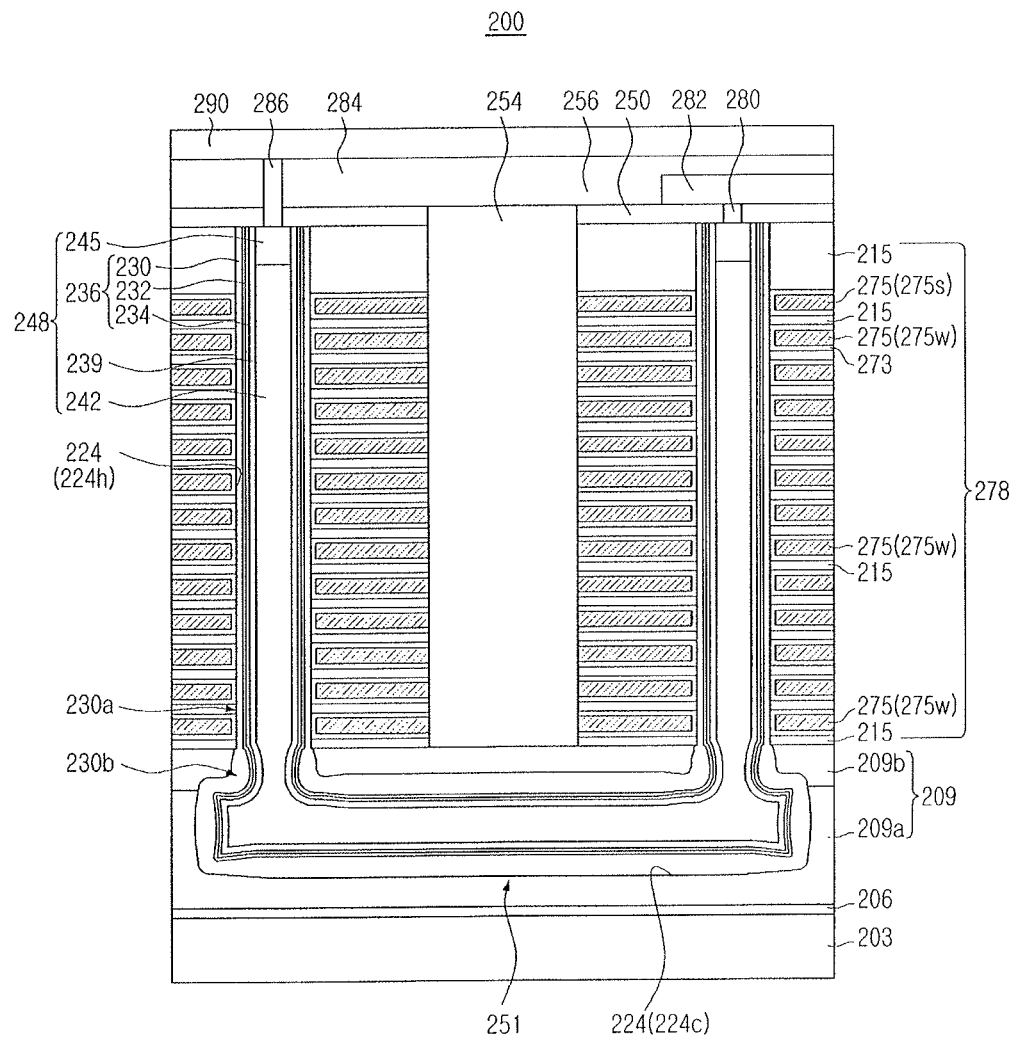
FIG. 8 illustrates a cross-sectional view of a semiconductor device according to another example embodiment.
Figure 9A:
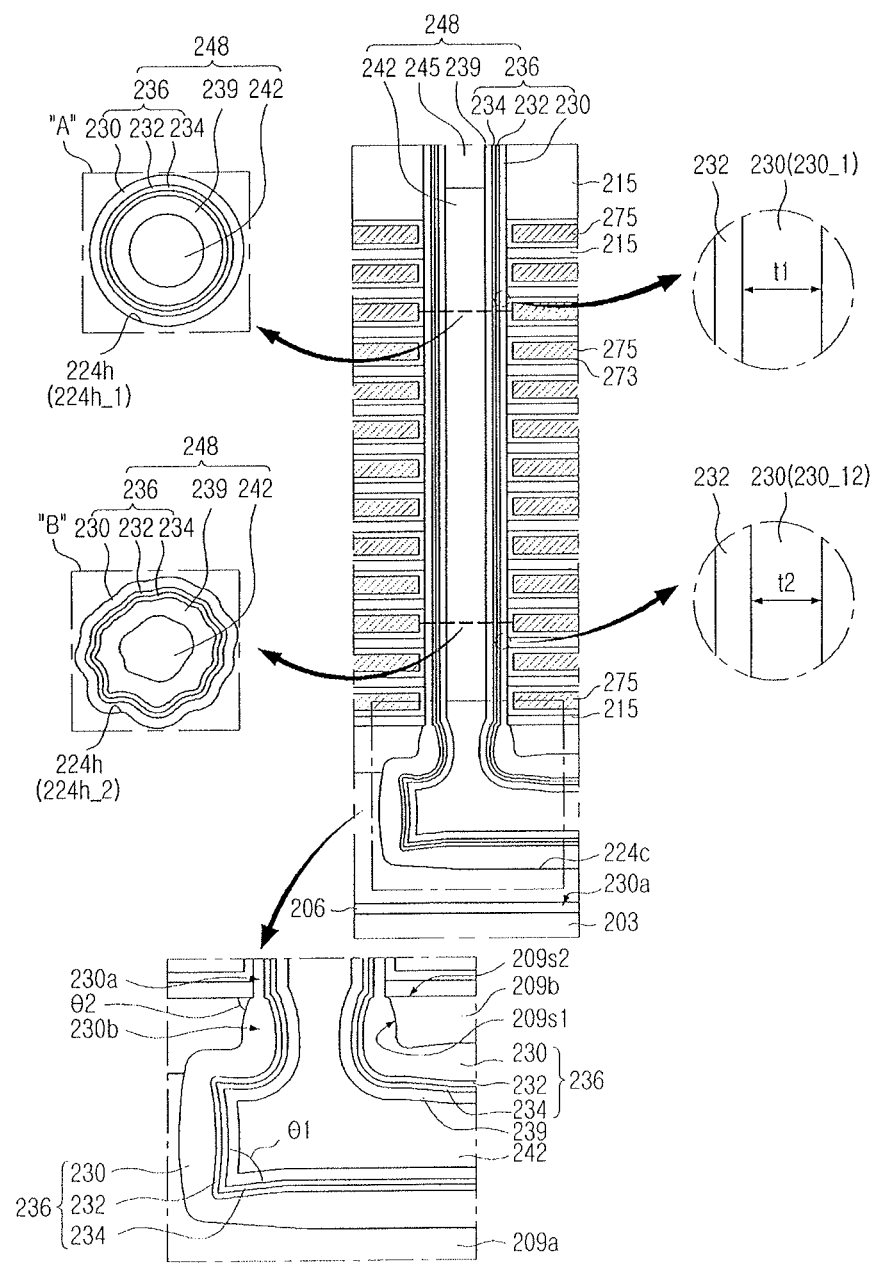
FIG. 9A illustrates a cross-sectional view of an example of a semiconductor device according to another example embodiment.
Figure 9B:
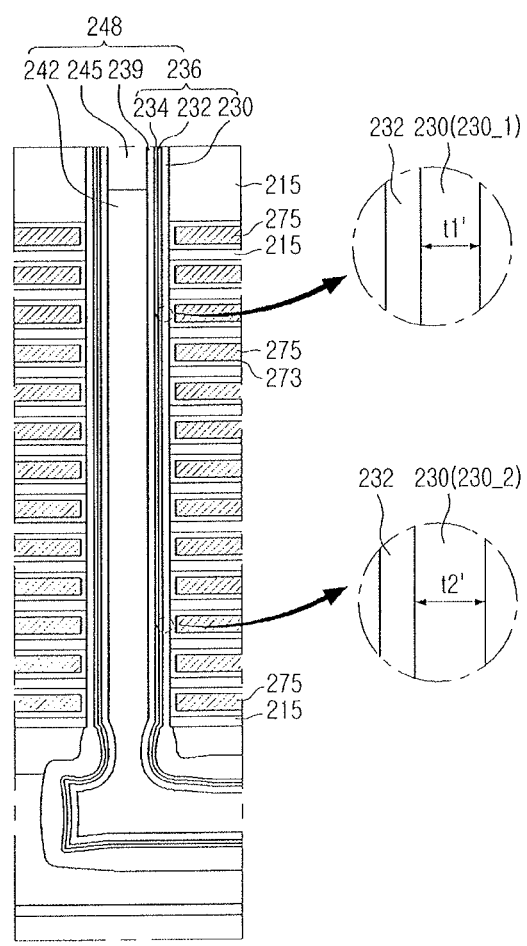
FIG. 9B illustrates a cross-sectional view of a modified example of a semiconductor device according to another example embodiment.

Next, a semiconductor device according to another example embodiment will be described with reference to FIG. 8. FIG. 8 is a cross-sectional view of a semiconductor device according to another example embodiment. FIG. 9A is an enlarged cross-sectional view illustrating a portion of the cross-sectional view of FIG. 8 to illustrate an example of constituent elements of a semiconductor device according to another example embodiment. FIG. 9B is an enlarged cross-sectional view illustrating a portion of the cross-sectional view of FIG. 8 to illustrate a modified example of constituent elements of a semiconductor device according to another example embodiment. Portions "A" and "B" in FIG. 9A are enlarged plan views illustrating portions of a hole 224h and a vertical structure 248.

With reference to 8 and 9A, a semiconductor device 200 according to another example embodiment may include a substrate 203, a lower insulating layer 206 on the substrate 203, and a lower pattern 209 on the lower insulating layer 206.

The substrate 203 may be a semiconductor substrate. The lower pattern 209 may include a first lower pattern 209a and a second lower pattern 209b on the first lower pattern 209a. The first and second lower patterns 209a and 209b may be formed of a semiconductor material or a doped silicon material. The lower pattern 209 may be a back gate electrode or a pipe gate electrode.

The semiconductor device 200 according to the example embodiment may include a stack structure 278, a first upper insulating layer 250, a separation pattern 254, an opening 224, the vertical structures 248, and a connection portion 251.

The stack structure 278 may be disposed on the lower pattern 209. The stack structure 278 may include interlayer insulating layers 215 and gate electrodes 275 stacked sequentially. The gate electrodes 275 may be interposed between the interlayer insulating layers 215. The gate electrodes 275 may include first gate electrodes 275w and a second gate electrode 275s on the first gate electrodes 275w. The second gate electrode 275s may be an uppermost gate electrode among the gate electrodes 275, and may be referred to as a select gate electrode. The first gate electrodes 275w may include word lines.

The first upper insulating layer 250 may be disposed on the stack structure 278. The separation pattern 254 may penetrate through the first upper insulating layer 250 and the stack structure 278. The separation pattern 254 may be formed of an insulating material such as a silicon oxide or the like.

The opening 224 may include hole regions 224h penetrating through the stack structure 278 on two sides of the separation pattern 254, and a connection opening 224c extending from the hole regions 224h into the lower pattern 209 below the separation pattern 254. Each of the hole regions 224h may include a first hole region 224h_1 and a second hole region 224h_2 below the first hole region 224h_1. The first hole region 224h_1 may have a shape closer than a shape of the second hole region 224h_2 to a circular shape. The second hole region 224h_2 may have the same shape as that of the second hole region 15b (see FIG. 15b).

The vertical structures 248 may be disposed within the hole regions 224h, and the connection portion 251 may be disposed within the connection opening 224c. The vertical structures 248 disposed on two sides of the separation pattern 254 may be connected to each other through the connection portion 251. The connection portion 251 may be embedded in the lower pattern 209 and may be continuously formed from lower regions of the vertical structures 248.

Each of the vertical structures 278 may include a core pattern 242 penetrating through the gate electrodes 275, and the interlayer insulating layers 215 between the gate electrodes 275, a pad 245 on the core pattern 242, a semiconductor layer 239 between the core pattern 242 and the stack structure 278, and a dielectric structure 236 between the semiconductor layer 239 and the stack structure 278. The connection portion 251 may be formed by extending the core patterns 242, the semiconductor layers 239, and the dielectric structures 236 of the vertical structures 278.

The dielectric structure 236 may include a first dielectric layer 230, a second dielectric layer 232, and a third dielectric layer 234. The second dielectric layer 232 may be interposed between the first and third dielectric layers 230 and 234. The third dielectric layer 234 may be interposed between the second dielectric layer 232 and the semiconductor layer 239. The first to third dielectric layers 230, 232 and 234 may be formed of the same material as the first to third dielectric layers 26, 28 and 30 described above with reference to FIG. 1. The stack structure 278 may further include fourth dielectric layers 273 interposed between the gate electrodes 275 and the interlayer insulating layers 215 and extending between the vertical structures 248 and the gate electrodes 275.

The dielectric structure 236 may be bent while forming an acute angle θ1 at corners of the connection opening 224c. A surface of the dielectric structure 236 in contact with the semiconductor layer 239 may be bent while forming the acute angle θ1.

The first dielectric layer 230 may include a first portion 230a in the hole region 224h penetrating through the stack structure 278, and a second portion 230b in the connection opening 224c.

In the case of the first dielectric layer 230, the second portion 230b may be in contact with the lower pattern 209. In an example of the first dielectric layer 230, the second portion 230b may have a thickness 1.5 or more times greater than that of the first portion 230a. In detail, the thickness of the second portion 230b may be about 1.5 to about 5 times greater than that of the first portion 230a. In an example of the first dielectric layer 230, a thickness of the second portion 230b may be about 2 to about 5 times greater than that of the first portion 230a. In an example of the first dielectric layer 230, a thickness of the second portion 230b may be about 2 to 3 times greater than that of the first portion 230a.

The second lower pattern 209b of the lower pattern 209 may include a first surface 209s1 and a second surface 209s2. The second surface 209s2 of the second lower pattern 209b may be parallel to a surface 203a of the substrate 203. The second surface 209s2 of the second lower pattern 209b may be in contact with the interlayer insulating layer 215 of the stack structure 278. The first surface 209s1 of the second lower pattern 209b may be in contact with the second portion 230b of the first dielectric layer 230. The first surface 209s1 of the second lower pattern 209b may form an acute angle θ2 with the second surface 209s2.

The semiconductor device 200 according to another example embodiment may include a source contact plug 280, a source line 282, a second upper insulating layer 284, a bit line contact plug 286, and a bit line 290. The source contact plug 280 may penetrate through the first upper insulating layer 250 and be electrically connected to the pad 245 of one of the vertical structures 248 on two sides of the separation pattern 254. The source line 282 may be electrically connected to the source contact plug 280.

The second upper insulating layer 284 may be disposed on the first upper insulating layer 250 and the source line 282. The bit line contact plug 286 may penetrate through the first and second upper insulating layers 250 and 284 to be electrically connected to the other vertical structure 248, not connected to the source contact plug 280, among the vertical structures 248 on two sides of the separation pattern 254. The bit line 290 may be electrically connected to the bit line contact plug 286.

Next, examples of a method of manufacturing a semiconductor device according to example embodiments will be described.

Figure 10A:
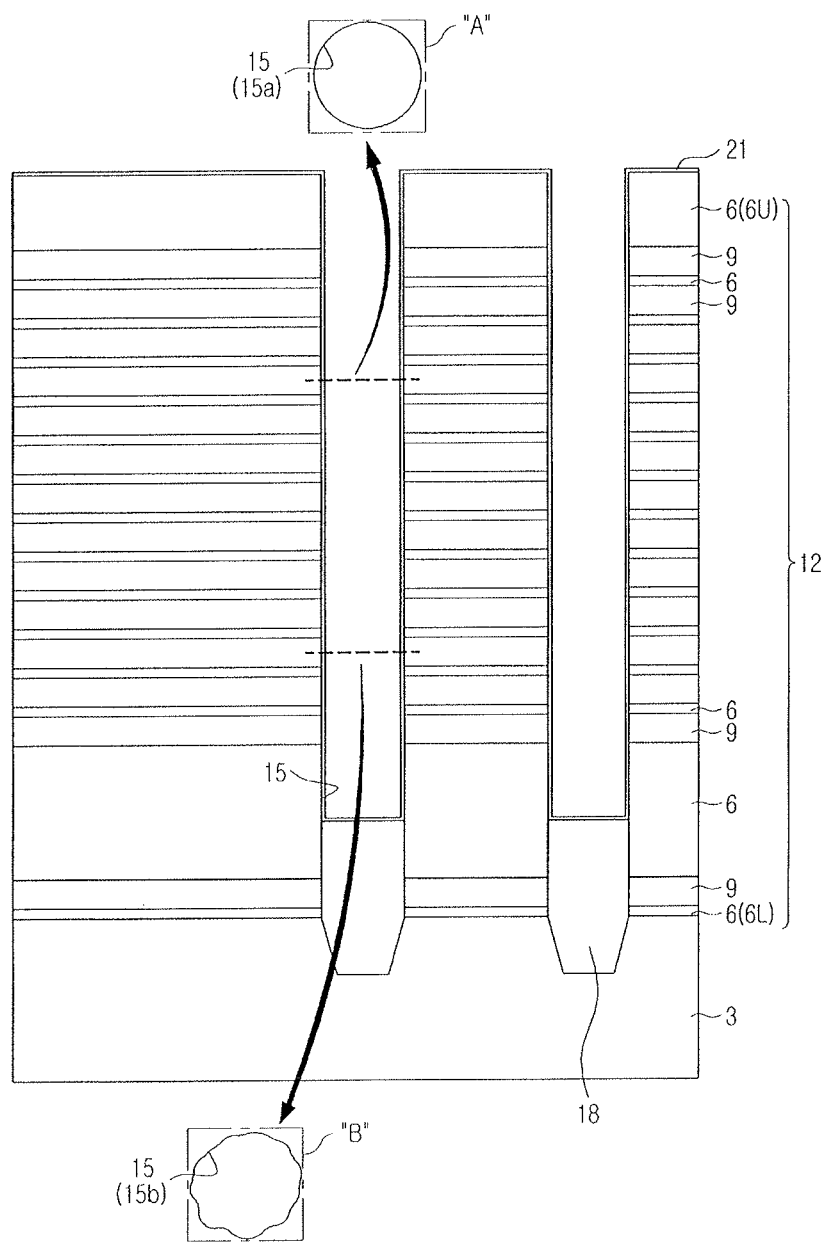
FIGS. 10A to 10I illustrate cross-sectional views of stages in a method of manufacturing a semiconductor device according to an example embodiment.

FIGS. 10A to 10I are cross-sectional views of one side of the semiconductor device in the perspective view of FIG. 1 to illustrate stages in a method of manufacturing the semiconductor device 1 according to the example embodiment. An example of a method of manufacturing the semiconductor device 1 according to the example embodiment described above with reference to FIG. 1 will be described with reference to FIGS. 10A to 10I. Portions "A" and "B" in FIG. 10A are plan views of an opening.

Referring to FIG. 10A, the substrate 3 may be provided. The substrate 3 may be a semiconductor substrate. A molded structure 12 may be formed on the substrate 3. The molded structure 12 may include interlayer insulating layers 6 and sacrificial gate layers 9 alternately stacked on each other. In the case of the molded structure 12, a lowermost layer and an uppermost layer may be interlayer insulating layers.

The interlayer insulating layers 6 may be sequentially arranged in a direction perpendicular to an upper surface of the substrate 3 and may be spaced apart from each other. The sacrificial gate layers 9 may be respectively interposed between the interlayer insulating layers 6. The interlayer insulating layers 6 may be formed of, e.g., a silicon oxide. The sacrificial gate layers 9 may be formed of, e.g., a silicon nitride.

An opening 15 may be formed to penetrate through the molded structure 12 and to extend into the substrate 3, to allow the substrate 3 to be exposed. For example, due to a high aspect ratio of the opening 15, a shape of a bottom portion of the opening 15 may be irregularly formed to be distorted relative to a top portion of the opening 15, e.g., sidewalls of the bottom portion of the opening 15 may not be circular as the top portion but may be uneven to have irregularly arranged convex and concave portions along its perimeter. In detail, the opening 15 may include the first hole region 15a and the second hole region 15b. The first hole region 15a may be located on the second hole region 15b, e.g., the second hole region 15b may be between the substrate 3 and the first hole region 15a. The first hole region 15a may have a shape closer to a circular shape than a shape of the second hole region 15b thereto. In other words, the first hole region 15a may have a substantially circular shape in a top view, while the second hole region 15b may have a shape including both a concave portion and a convex portion along its perimeter in a top view. For example, the second hole region 15b may have a distorted circular cross-sectional shape including curved portions, e.g., series of ridges, or concave-convex portions in which concave portions and convex portions are repeatedly formed, e.g., along a curve.

A lower pattern 18 filling a lower region of the opening 15 may be formed. The lower pattern 18 may be an epitaxial material layer formed using a selective epitaxial growth (SEG) process on the substrate 3. The lower pattern 18 may be formed of a semiconductor material grown from the substrate 3 exposed by the opening 15, e.g., formed of monocrystalline silicon.

A source layer 21, a conformal layer, may be formed above the substrate 3 having the lower pattern 18, e.g., the source layer 21 may be formed conformally on the molded structure 12 to have a uniform thickness and to trace the profiles of the sidewalls and bottom of each opening 15. The source layer 21 may be formed of a material different from the interlayer insulating layers 6 and the sacrificial gate layers 9 of the molded structure 12. For example, the interlayer insulating layers 6 may be formed of a silicon oxide, the sacrificial gate layers 9 may be formed of a silicon nitride, and the source layer 21 may be formed of a semiconductor material. In an example, the source layer 21 may be formed as a silicon layer. In an example, the source layer 21 may be formed as a silicon layer containing an impurity. The impurity may be, e.g., carbon (C), boron (B), or phosphorus (P).

Figure 10B:
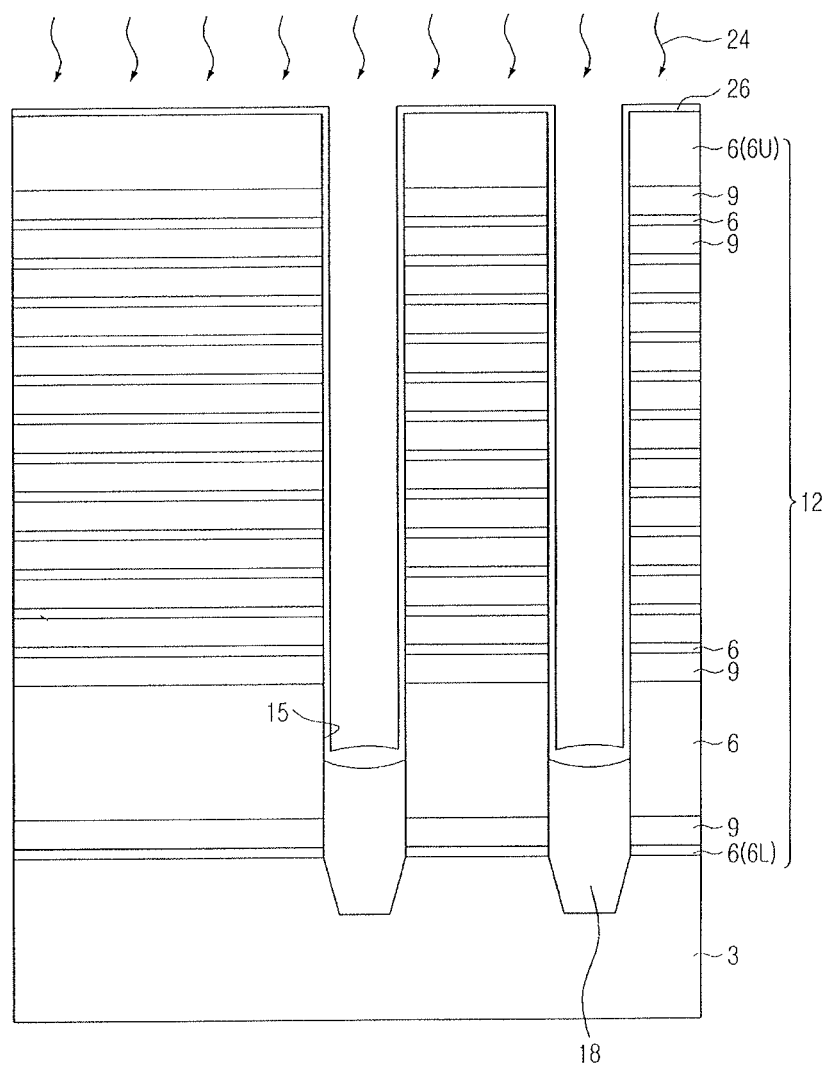

Referring to FIG. 10B, a first dielectric layer 26 may be formed by performing an oxidation process (24). The oxidation process (24) may be directed toward the molded structure 12 covered by the source layer 21 to completely oxidize the source layer 21 without oxidizing the molded structure 12.

In detail, the oxidation process (24) may include application of an oxidation gas to the source layer 21, such that the oxidation process (24) oxidizes the entirety of the source layer 21 without substantially oxidizing the molded structure 12. For example, the oxidation process (24) may last for a sufficient time to oxidize the entirety of the source layer 21, e.g., including portions of the source layer 21 on all the concave and convex portions in the second hole region 15b and a portion of the lower pattern 18, without substantially oxidizing the molded structure 12. For example, the resultant oxidized source layer 21 with the oxidized upper portion of the lower pattern 18 may define the first dielectric layer 26. Thus, the first dielectric layer 26 may be formed to have a first thickness on the lower pattern 18, i.e., a thickness of the oxidized source layer 21 and the upper portion of the lower pattern 18, and to have a second thickness less than the first thickness on a sidewall of the opening 15, i.e., a thickness of the oxidized source layer 21. For example, if the oxidation process (24) were not to last for a sufficient time to oxidize the entire source layer 21, portions of the source layer 21 in the second hole region 15b would have remained un-oxidized due to lower oxidation rate, thereby causing non-uniform thickness.

The oxidation process (24) may be an oxidation process in which an oxygen radical is not used, e.g., to provide sufficient oxidation time for the entirety of the source layer 21 to oxidize without oxidizing the molded structure 12. That is, in order to substantially prevent the molded structure 12 from being oxidized, hydrogen ($H_2$) gas forming an O* radical may not be supplied, or an amount of supplied hydrogen ($H_2$) gas may be significantly reduced, in the oxidation process (24). As source gas used for the oxidation process (24), $O_2$ may be used, $H_2O$ may be used, $O_2$ and H₂O may be used, or O₂ and HCL may be used. The oxidation process (24) may be performed at a temperature of about 600° C. to about 850° C.

Figure 10C:
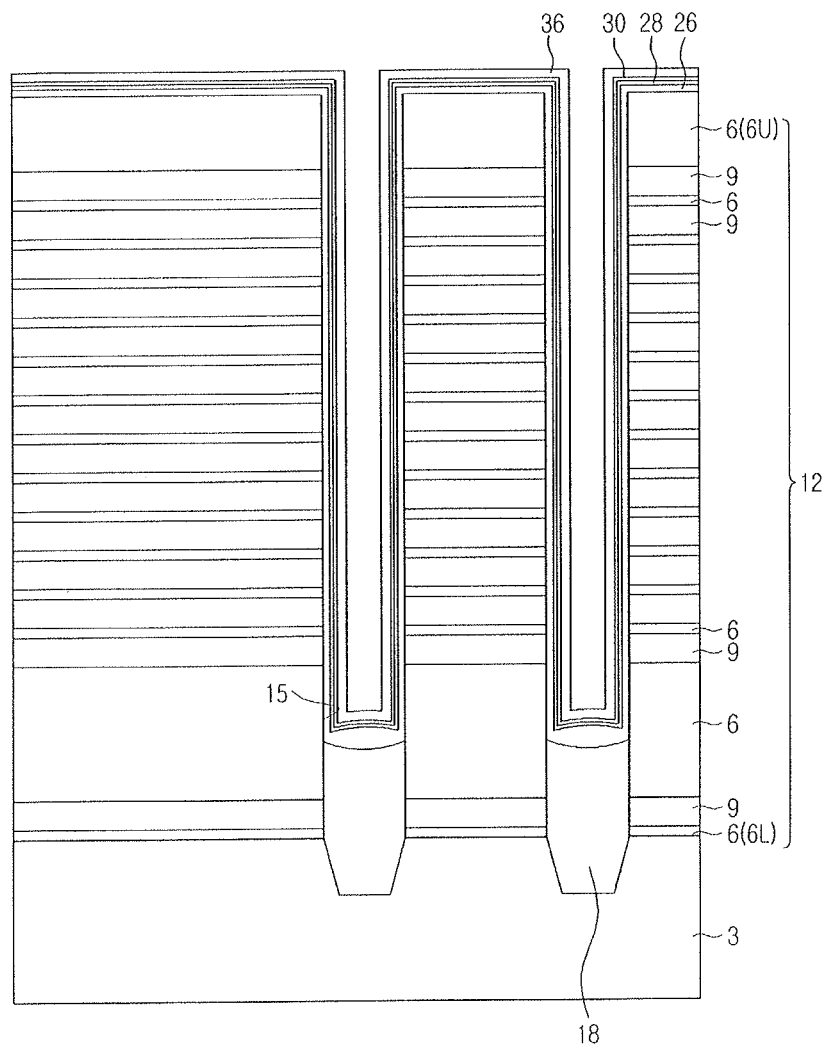

Referring to FIG. 10C, a second dielectric layer 28, a third dielectric layer 30, and a sacrificial spacer layer 36 may be sequentially, e.g., and conformally, formed on the first dielectric layer 26. Since the material types of the first to third dielectric layers 26, 28 and 30 have been described above with reference to FIG. 1, a detailed description thereof will be omitted. The sacrificial spacer layer 36 may be formed of polysilicon.

Figure 10D:
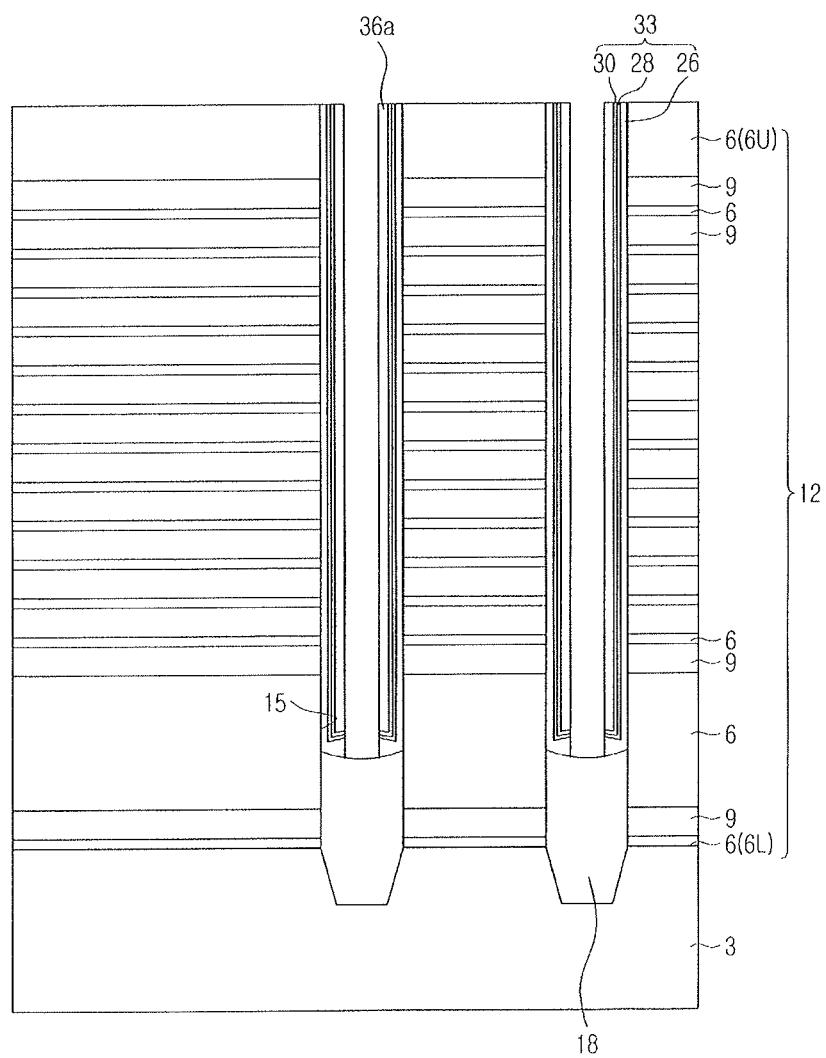

Referring to FIG. 10D, the sacrificial spacer layer 36 and the first to third dielectric layers 26, 28, and 30 may be anisotropically etched to allow the lower patterns 18 to be exposed. The sacrificial spacer layer 36 may be etched to be formed as sacrificial spacers 36a, and the first to third dielectric layers 26, 28 and 30 may be etched to be configured as a dielectric structure 33.

Figure 10E:
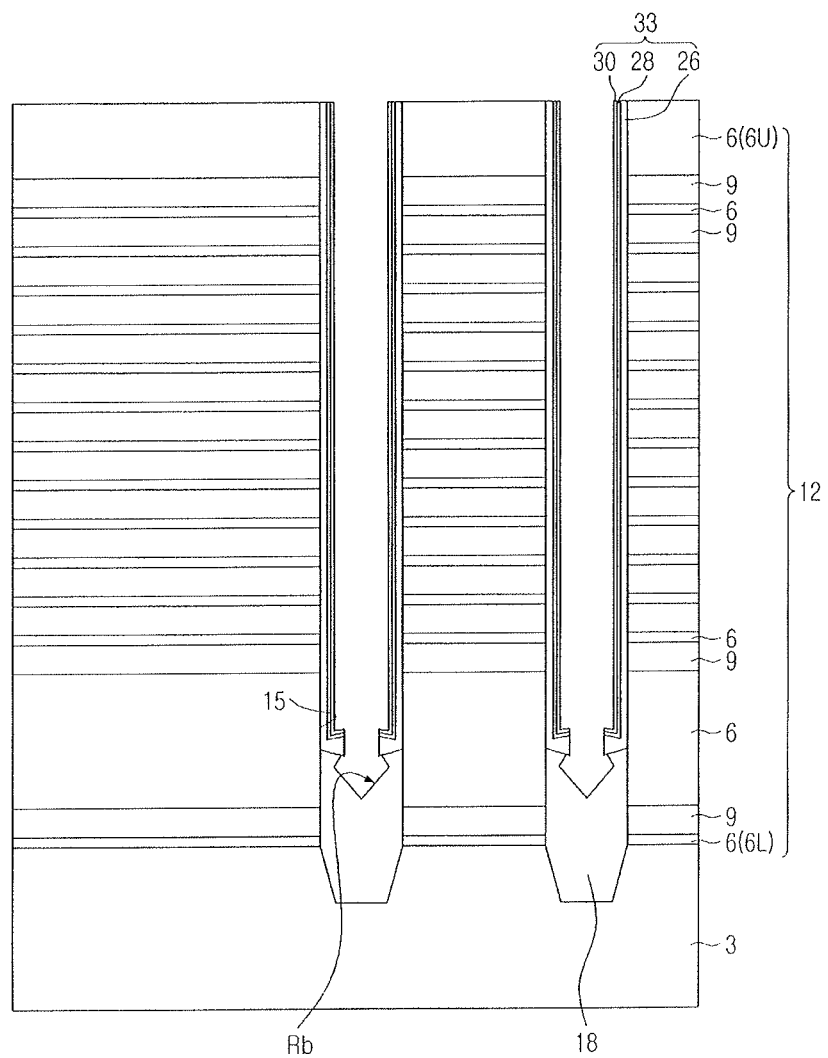

Referring to FIG. 10E, the lower pattern 18 may be etched to form a recessed region R recessed from an upper surface of the exposed lower pattern 18. The sacrificial spacer 36a may be removed. The recessed region R may be formed to have a shape corresponding to one of the recessed shapes Ra, Rb, and Re described above with reference to FIGS. 3A, 3B and 3C.

Figure 10F:
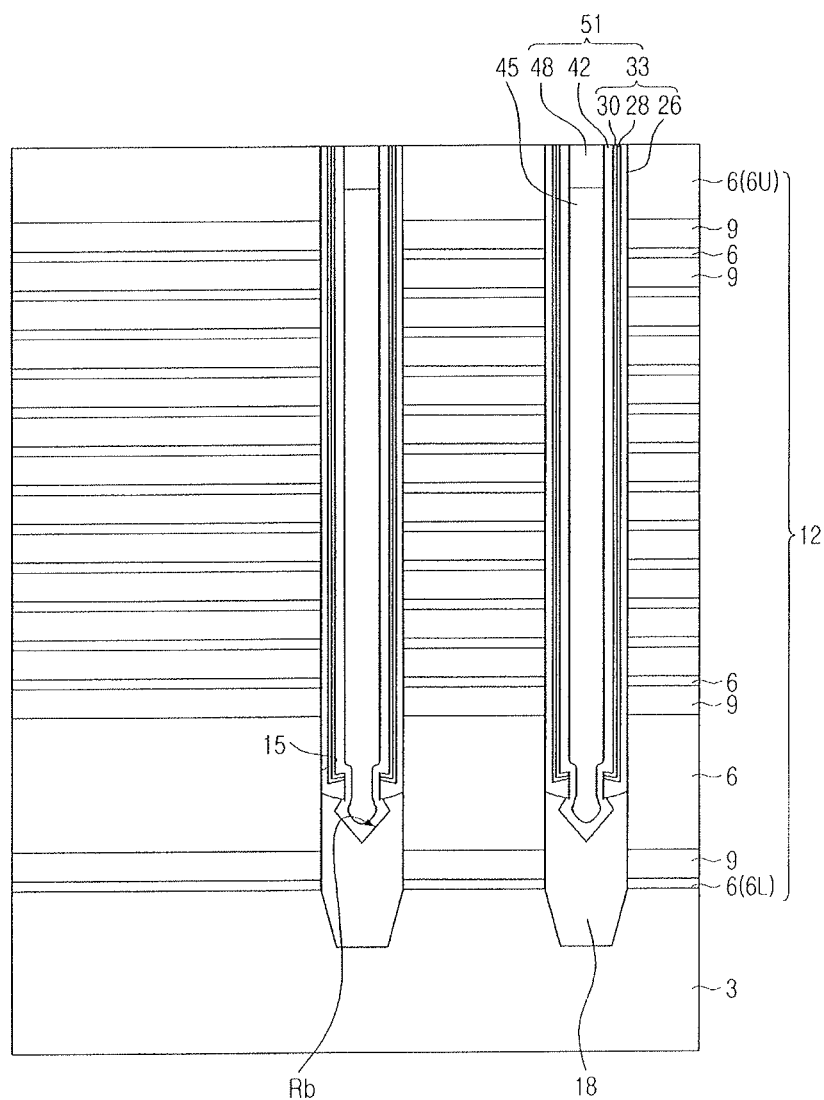

With reference to FIG. 10F, the semiconductor layer 42 may be formed on the lower pattern 18 having the recessed region Rb, and the core pattern 45 partially filling the opening 15 may be formed on the semiconductor layer 42. The pad 48 filling a remaining portion of the opening 15 may be formed on the core pattern 45. The dielectric structure 33, the core pattern 45, the semiconductor layer 42, and the pad 48 may configure, e.g., define, the vertical structure 51.

Figure 10G:
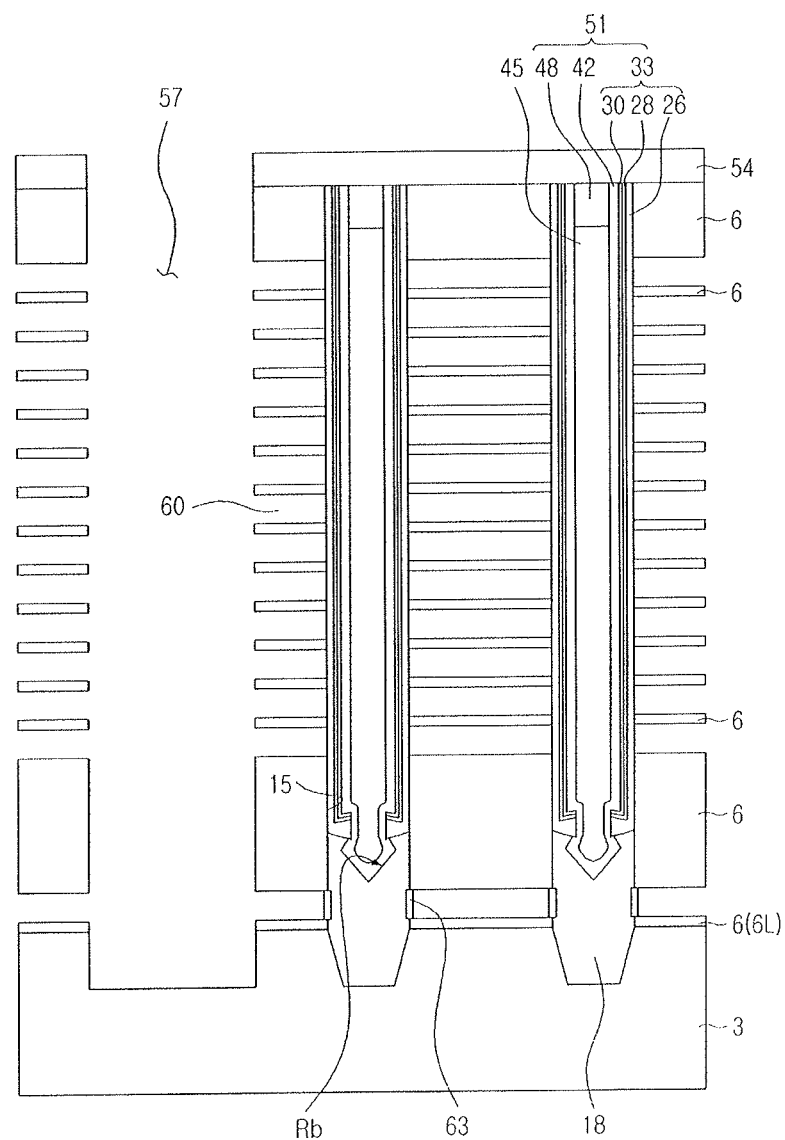

Referring to FIG. 10G, an upper insulating layer 54 may be formed on the molded structure 12. A separation opening 57 penetrating through the upper insulating layer 54 and the molded structure 12 to thus allow the substrate 3 to be exposed may be formed. The sacrificial gate layers 9 (see FIG. 10F) exposed by the separation opening 57 may be removed to form empty spaces 60 between the interlayer insulating layers 6. An oxide layer 63 may be formed on sidewalls of the lower pattern 18 exposed by the empty spaces 60.

Figure 10H:
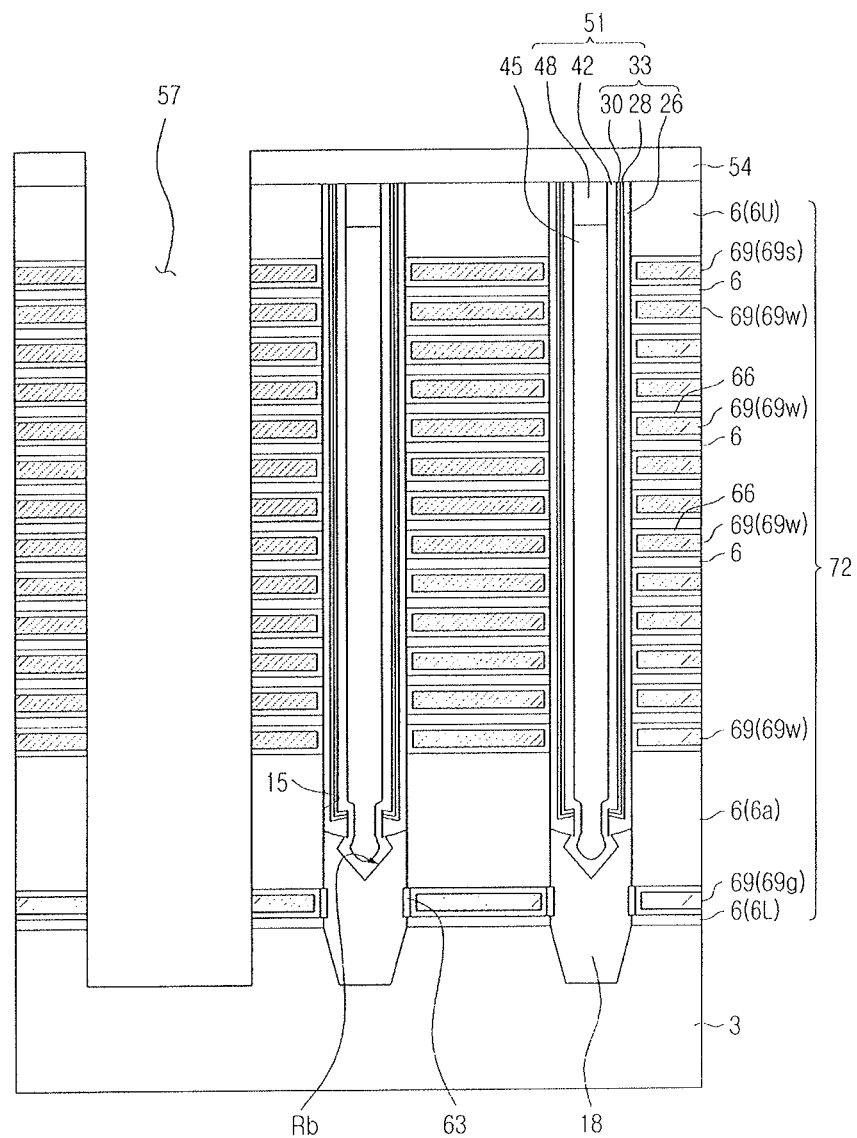

Referring to FIG. 10H, the fourth gate dielectric layers 66 and the gate electrodes 69 filling the empty spaces 60 (see FIG. 10G) may be formed. Thus, the stack structure 72 as described in FIG. 1 may be formed.

Figure 10I:
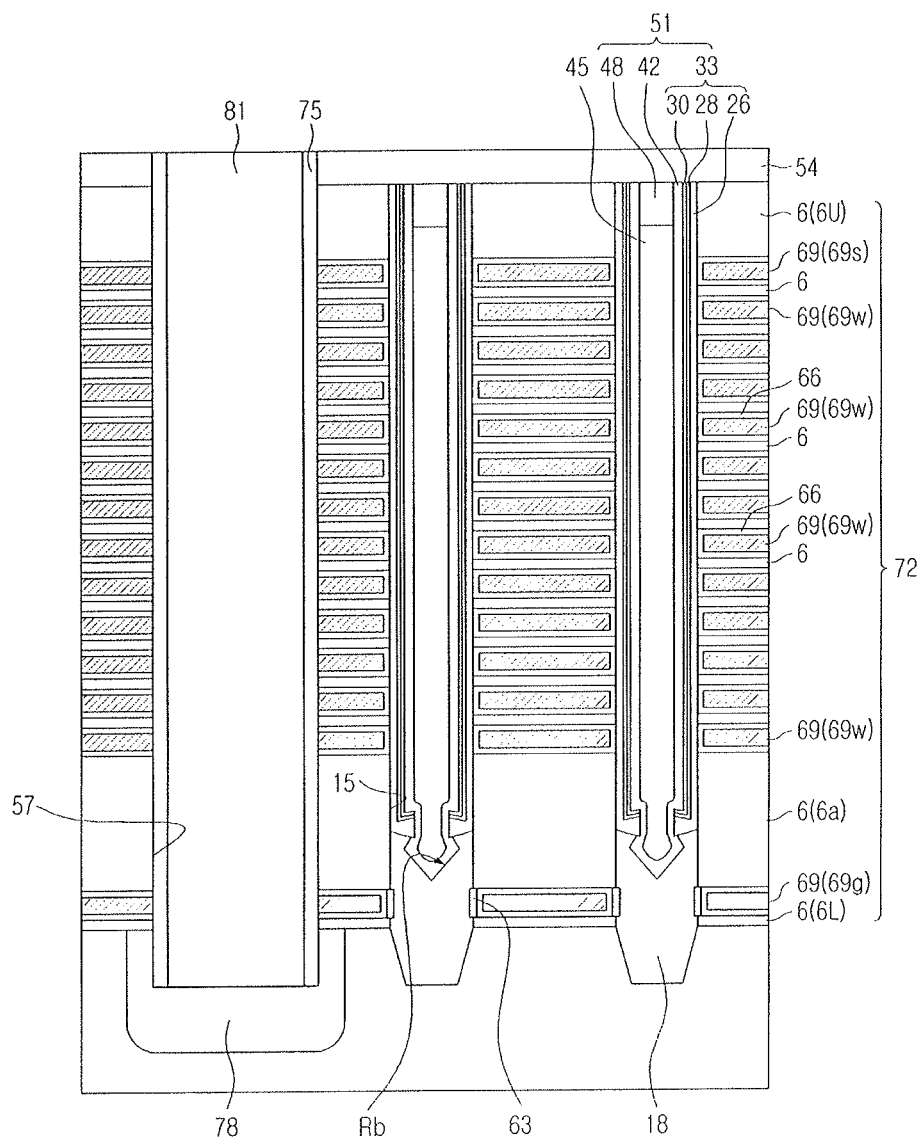

Referring to FIG. 10I, the insulating spacer 75 may be formed on sidewalls of the separation opening 57. The impurity region 78 may be formed in the substrate 3, to be provided below the separation opening 57. The separation pattern 81 filling the separation opening 57 may be formed.

Subsequently, a process of forming the contact plugs 87 and the bit lines 90, as illustrated in FIG. 1, may be performed. Thus, the semiconductor device 1 as described with reference to FIG. 1 may be formed.

Figure 11A:
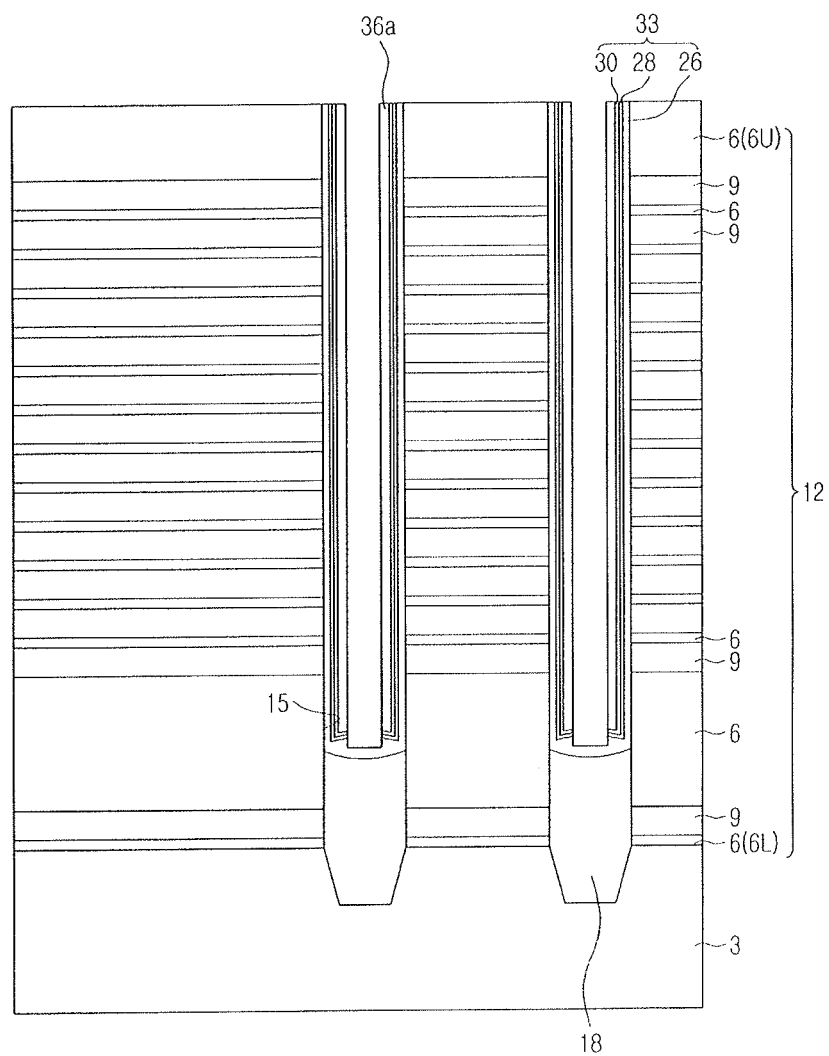
FIGS. 11A and 11B illustrate cross-sectional views of stages in a method of manufacturing a semiconductor device according to another example embodiment.
Figure 11B:
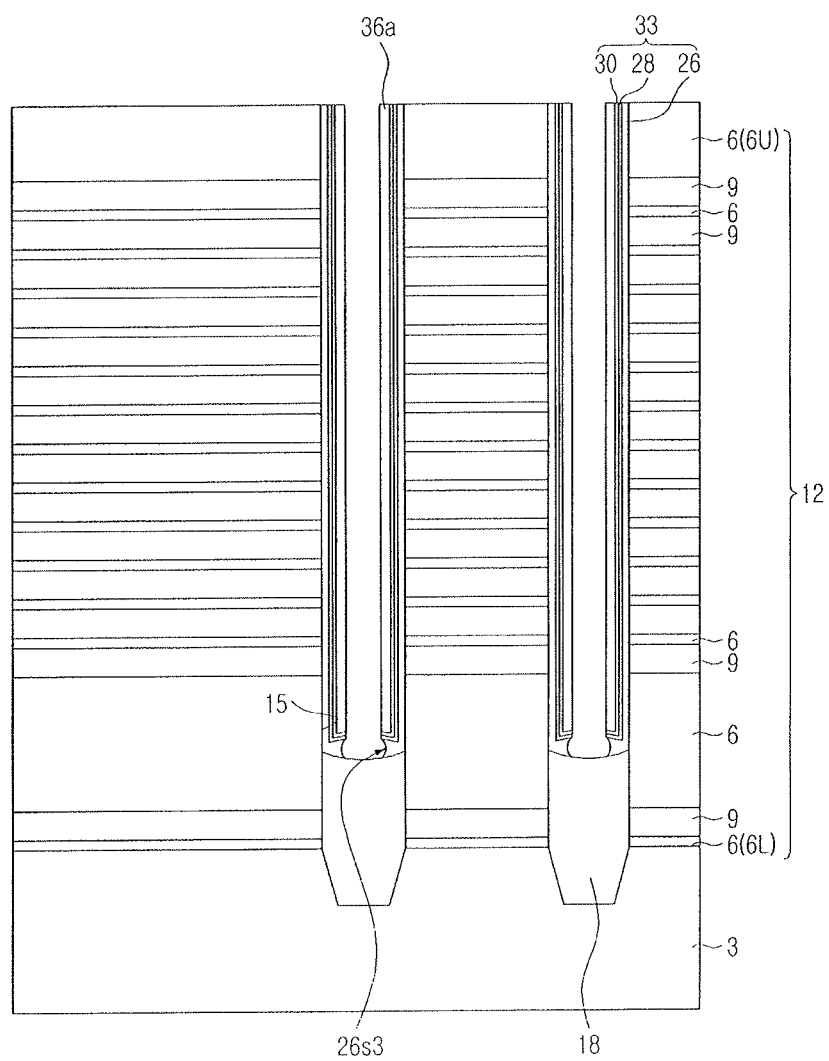

FIGS. 11A and 11B are cross-sectional views of one side of the semiconductor device in the perspective view of FIG. 1 to illustrate another example of a method of manufacturing the semiconductor device 1 according to example embodiments.

Referring to FIG. 11A, a substrate, such as a resultantly provided substrate, as described above with reference to FIGS. 10A to 10C, may be prepared. Next, the first dielectric layer 26 may be exposed, by etching the second and third dielectric layers 28 and 30 while anisotropically etching the sacrificial spacer layer 36 (see FIG. 10C). The sacrificial spacer layer 36 (see FIG. 10C) may be etched to be formed as sacrificial spacers 36a. In other words, as compared to FIG. 10D, the first dielectric layer 26 is only partially etched, so the lower pattern 18 is not exposed.

Next, referring to FIG. 11B, the exposed first dielectric layer 26 may be isotropically etched to expose the lower pattern 18. Thus, the isotropic etching causes an exposed surface of the first dielectric layer 26 to be concave, i.e., as the shape of the third surface 26s3' of the first dielectric layer 26 described above with reference to FIG. 4. Then, the sacrificial spacers 36a may be removed. Next, the semiconductor device may be formed by performing processes as described above with reference to FIGS. 10F to 10I.

Figure 12A:
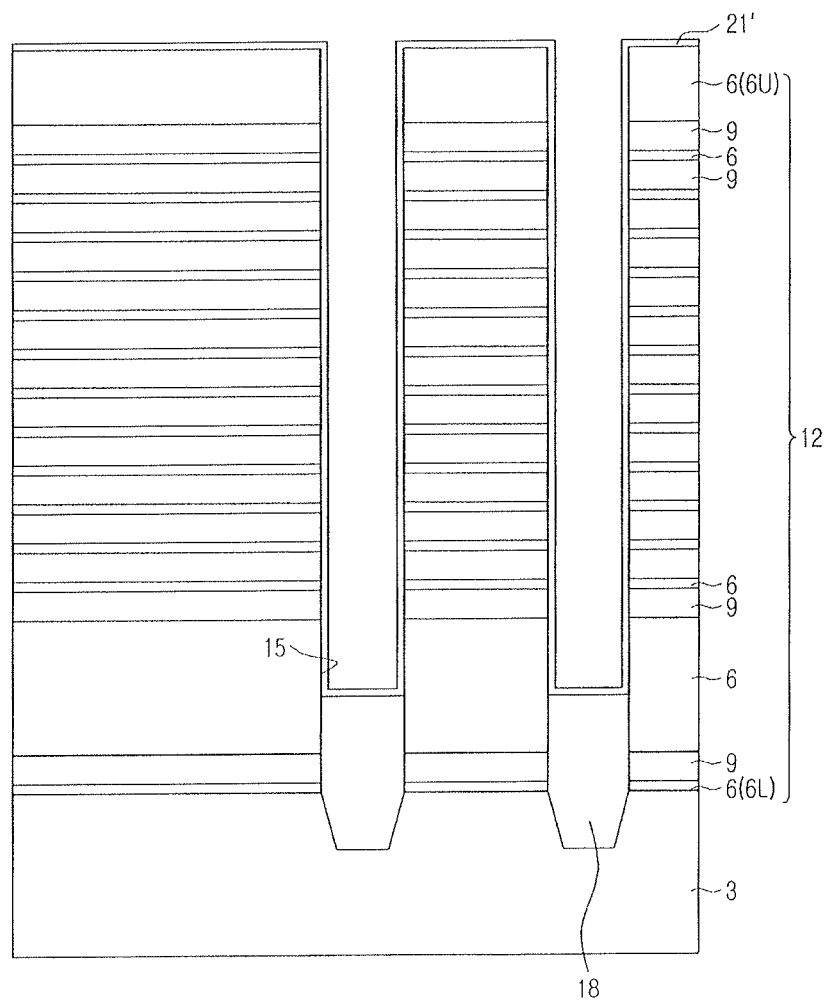
FIGS. 12A to 12C illustrate cross-sectional views of stages in a method of manufacturing a semiconductor device according to another example embodiment.
Figure 12B:
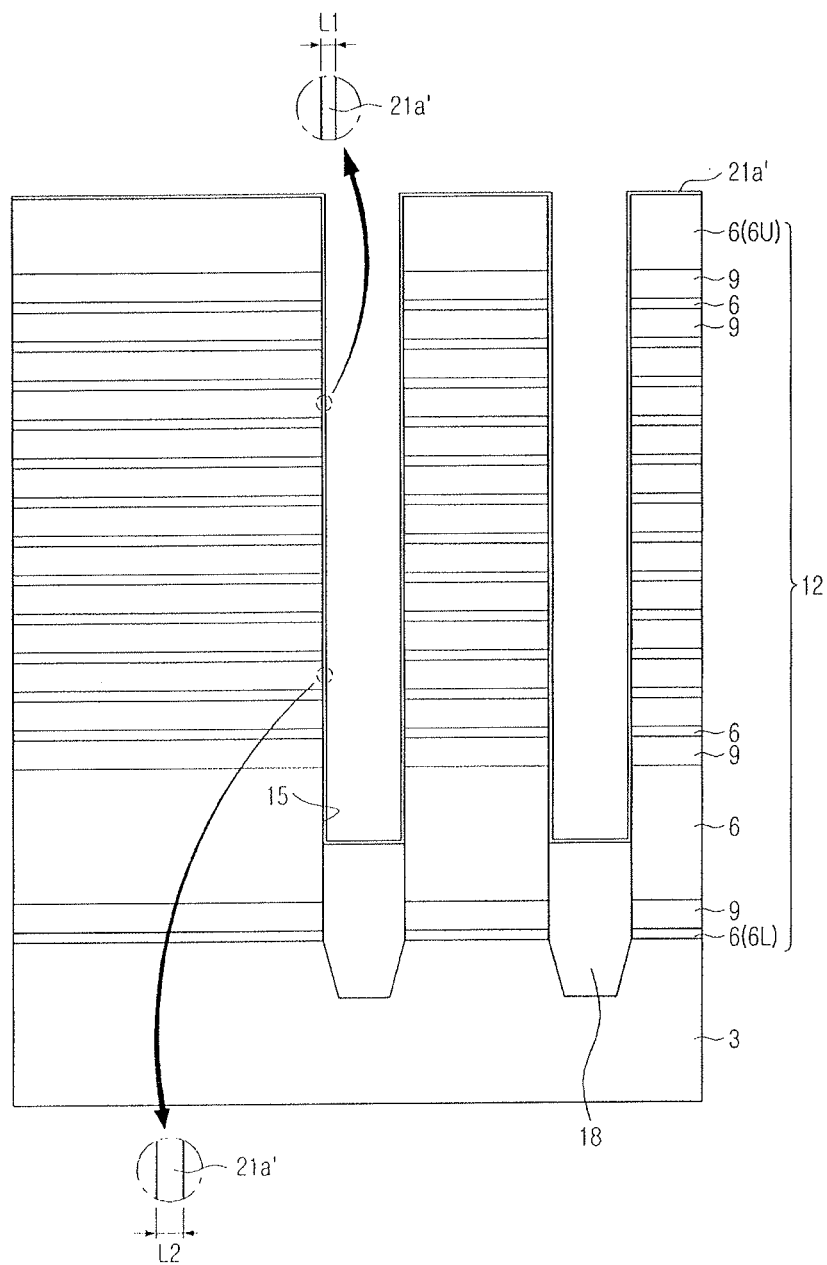
Figure 12C:
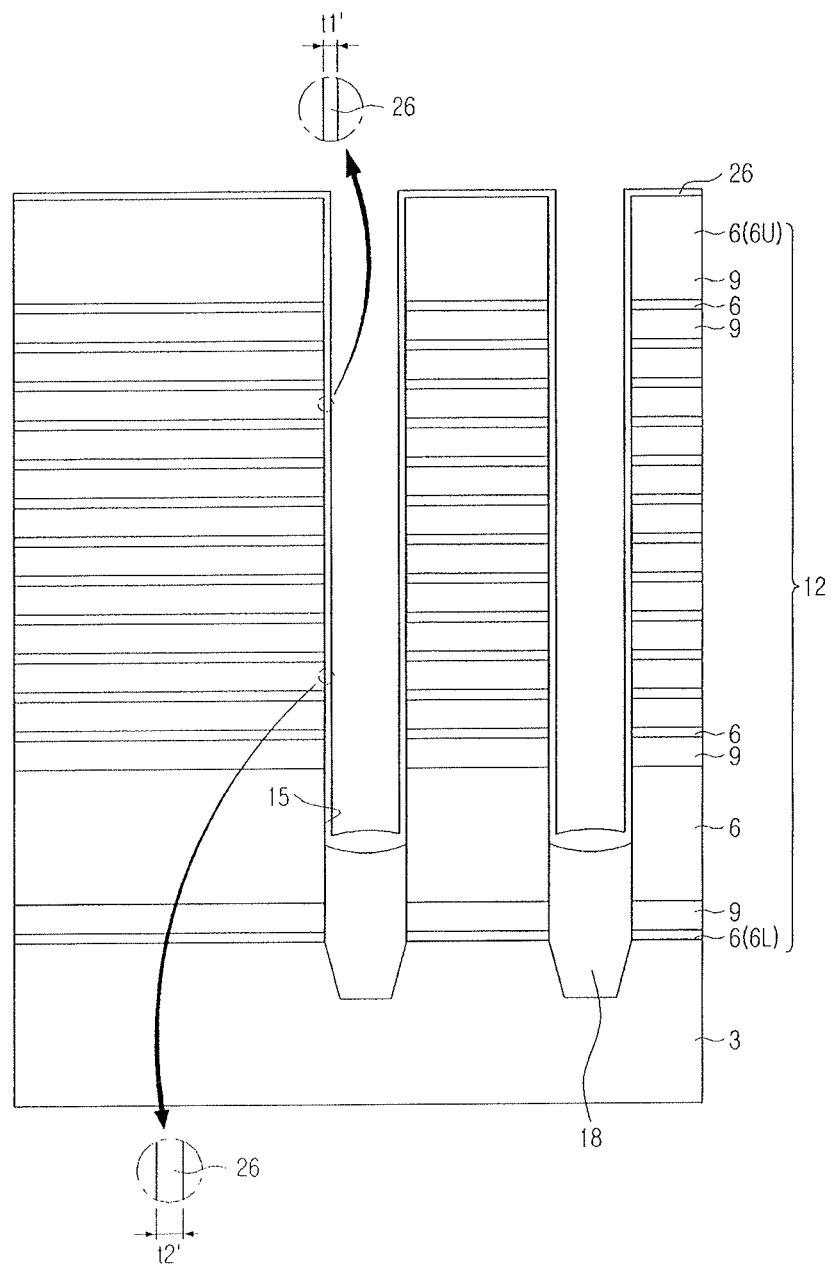

FIGS. 12A to 12C are cross-sectional views of one side of the semiconductor device in the perspective view of FIG. 1 to illustrate another example of a method of manufacturing the semiconductor device 1 according to example embodiments.

Referring to FIG. 12A, the molded structure 12 (see FIG. 10A) may be formed on the substrate 3 as described above with reference to FIG. 10A, the opening 15 (FIG. 10A) penetrating through the molded structure 12 (FIG. 10A) may be formed, and the lower pattern 18 (FIG. 10A) may be formed in a lower region of the opening 15 (FIG. 10A). A source layer 21', being relatively thick, may be conformally formed above the substrate having the lower pattern 18. The source layer 21' may have a thickness greater than that of the source layer 21 described above with reference to FIG. 10A, and may be formed of the same material as the source layer 21 (FIG. 10A).

Referring to FIG. 12B, a surface of the source layer 21' in the upper portion of the opening 15 may be partially etched, such that a thickness of a resultant source layer 21a' in the upper portion of the opening 15 may be lower than that in the lower portion of the opening 15. That is, the source layer 21a' may have a thickness L2 in a lower region if the opening 15 and a thickness L1 in an upper region of the opening 15, with the thickness L2 being greater than the thickness L1. The surface of the source layer 21' (FIG. 12A) may be etched by using an etching process using chlorine (Cl₂) gas.

Referring to FIG. 12C, the source layer 21a' in FIG. 12B, of which the lower region has the thickness L2 greater than the thickness L1 of the upper region thereof, may be oxidized using the oxidation process (24) as described above with reference to FIG. 10B. A portion of the lower pattern 18 may also be oxidized while the entirety of the source layer 21a' (FIG. 12B) is oxidized. As the entirety of the source layer 21a' (FIG. 12B) is oxidized, a first dielectric layer 26, of which a thickness t2' of a lower region is greater than a thickness t1' of an upper region thereof, may be formed. The first dielectric layer 26 may be formed as the first dielectric layer 26 described above with reference to FIG. 5B. Then, a semiconductor device may be formed by performing the same process as described with reference to FIGS. 10C to 10I.

Figure 13:
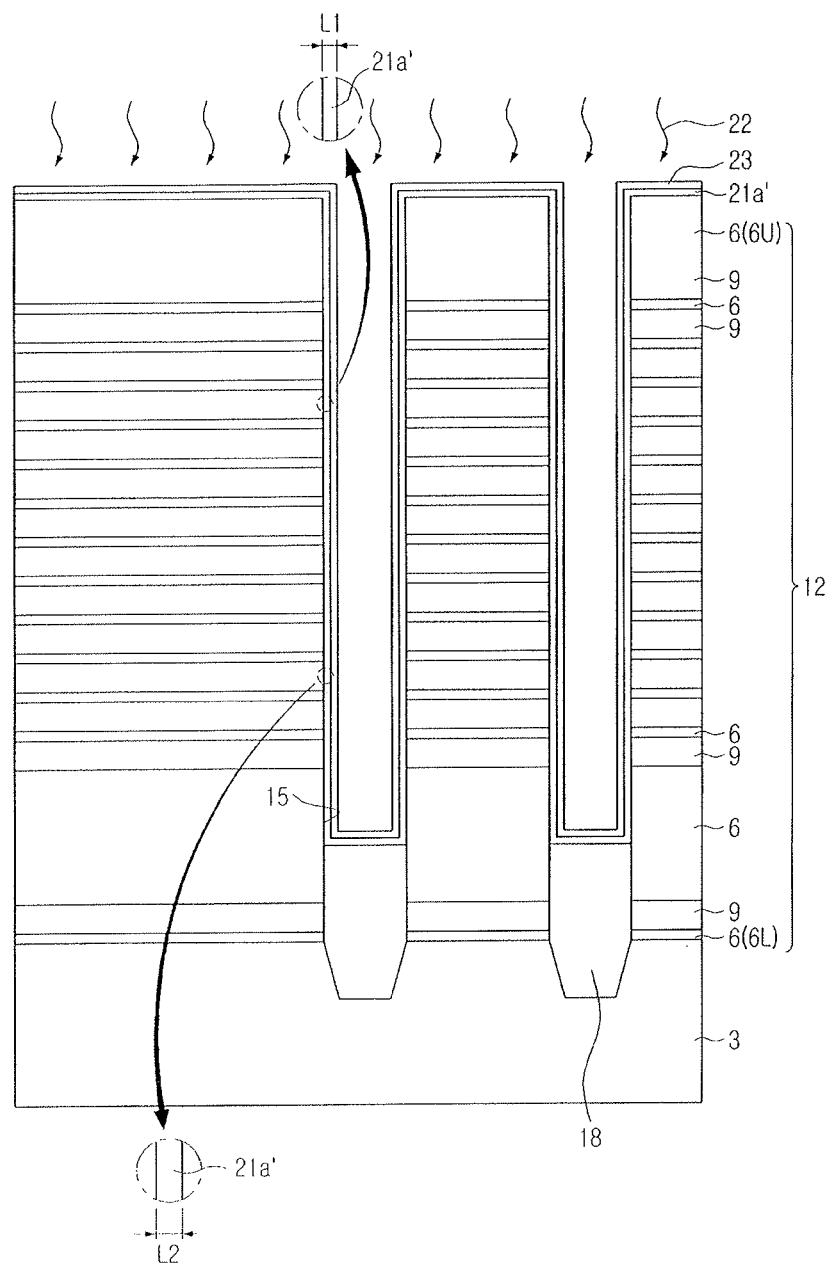
FIG. 13 illustrates a cross-sectional view of a stage in a method of manufacturing a semiconductor device according to another example embodiment.

FIG. 13 is a cross-sectional view of one side of the semiconductor device in the perspective view of FIG. 1 to illustrate another example of a method of manufacturing the semiconductor device 1 according to example embodiments.

Referring to FIG. 13, a substrate, such as a resultantly provided substrate, as described above with reference to FIG. 12A, may be prepared. An oxidation process (22) may be performed to oxidize a surface of the source layer 21' having a relatively great thickness, described above with reference to FIG. 12A and to thus form a sacrificial oxide layer 23, thereby forming a source layer 21a' having a reduced thickness. The source layer 21a' having a reduced thickness may have the same shape as that of the source layer 21a' described above with reference to FIG. 12B. Thus, in the case of the source layer 21a' having a reduced thickness, a thickness L2 of a lower region thereof may be greater than a thickness L1 of an upper region thereof.

The sacrificial oxide layer 23 may be selectively removed. Thus, substantially the same resultant structure as described above with reference to FIG. 12B may be formed. Next, as described with reference to FIG. 12C, after the source layer 21a' (see FIG. 12C) is oxidized, the semiconductor device may be formed by performing the process as illustrated in FIGS. 10C to 10I.

Figure 14A:
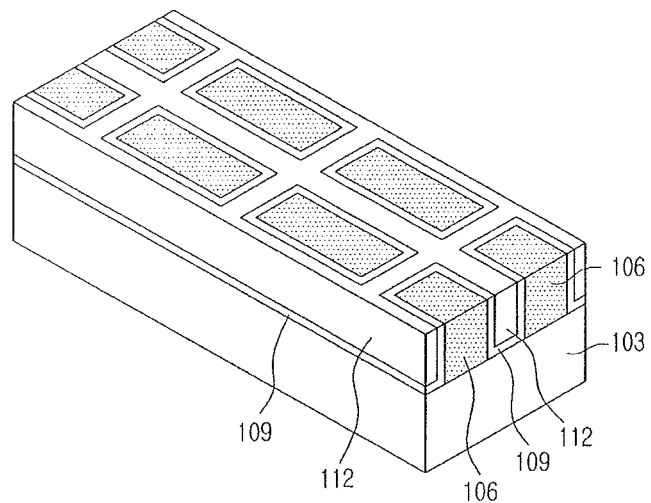
FIGS. 14A to 14K illustrate views of stages in a method of manufacturing a semiconductor device according to another example embodiment.
Figure 14B:
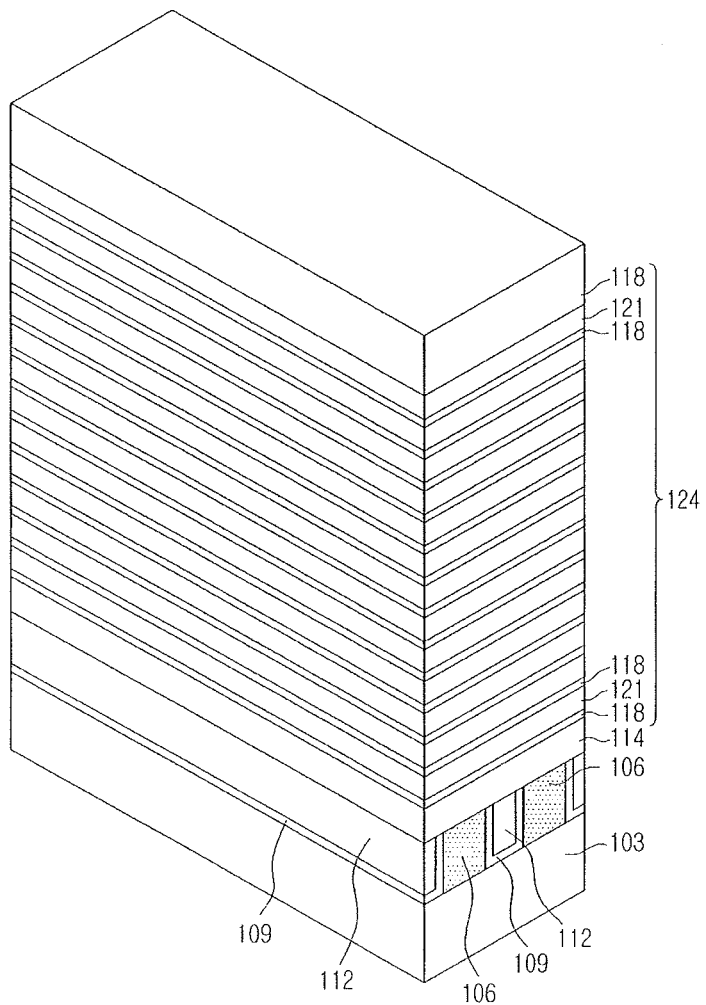
Figure 14C:
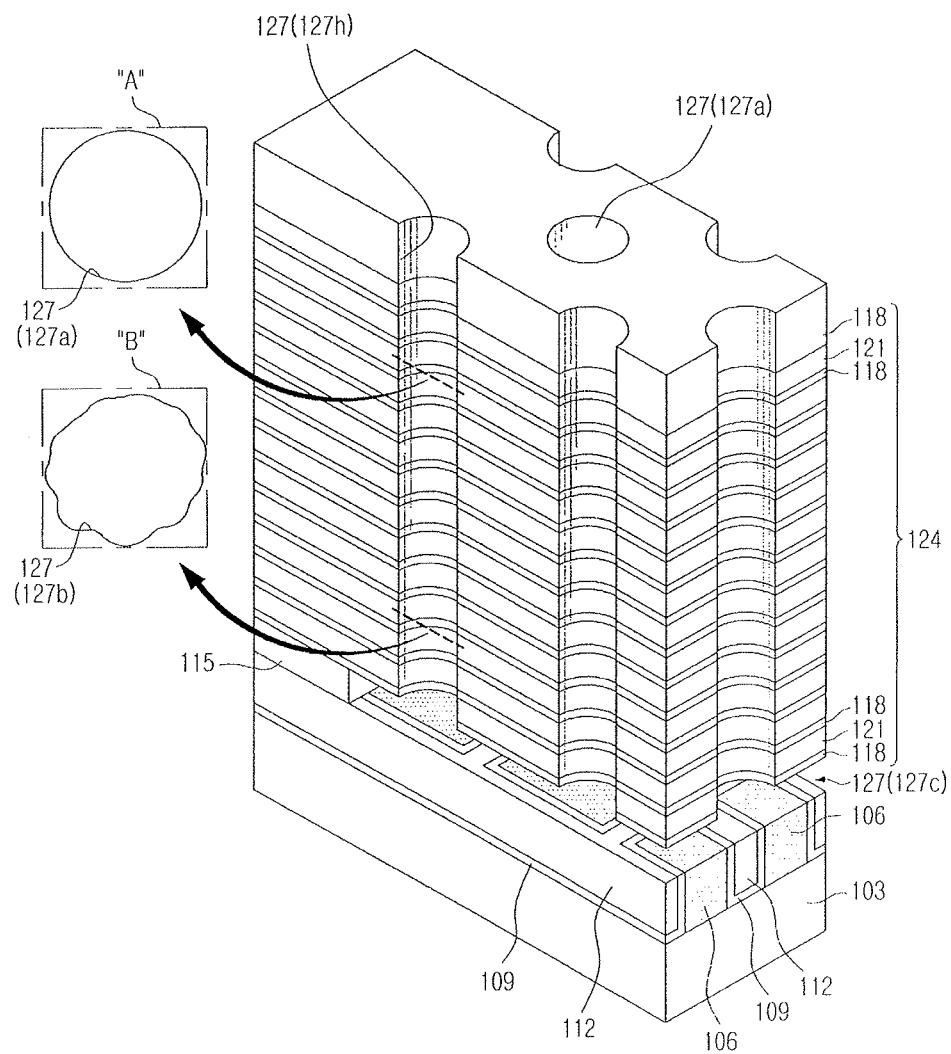
Figure 14D:
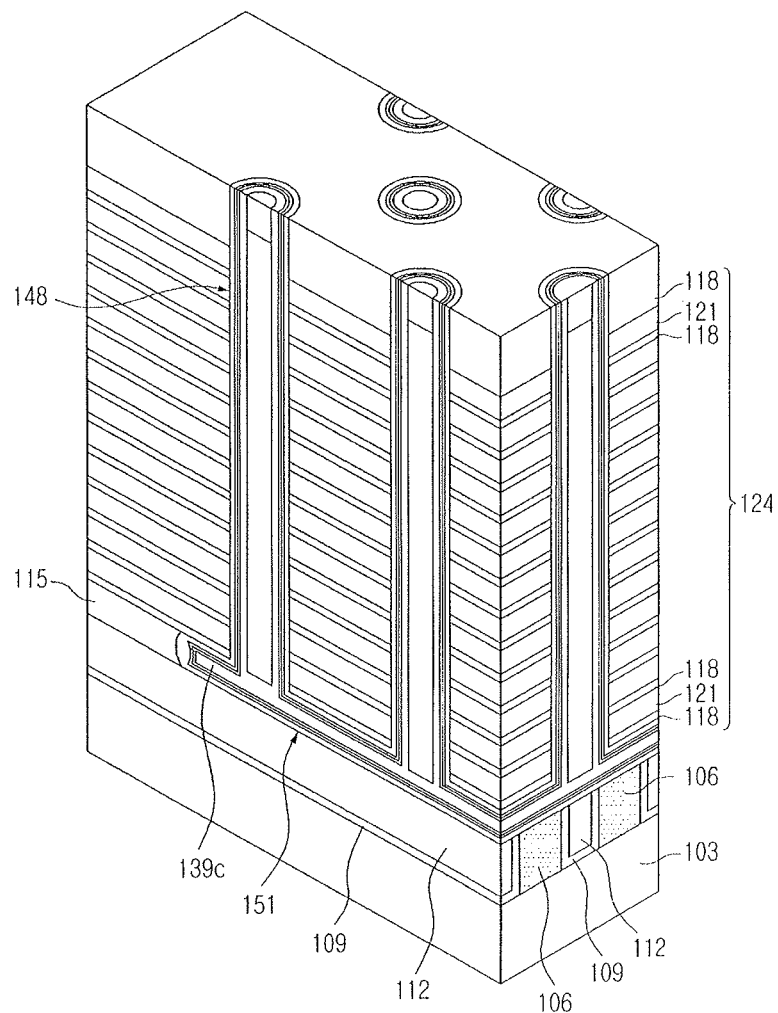
Figure 14E:
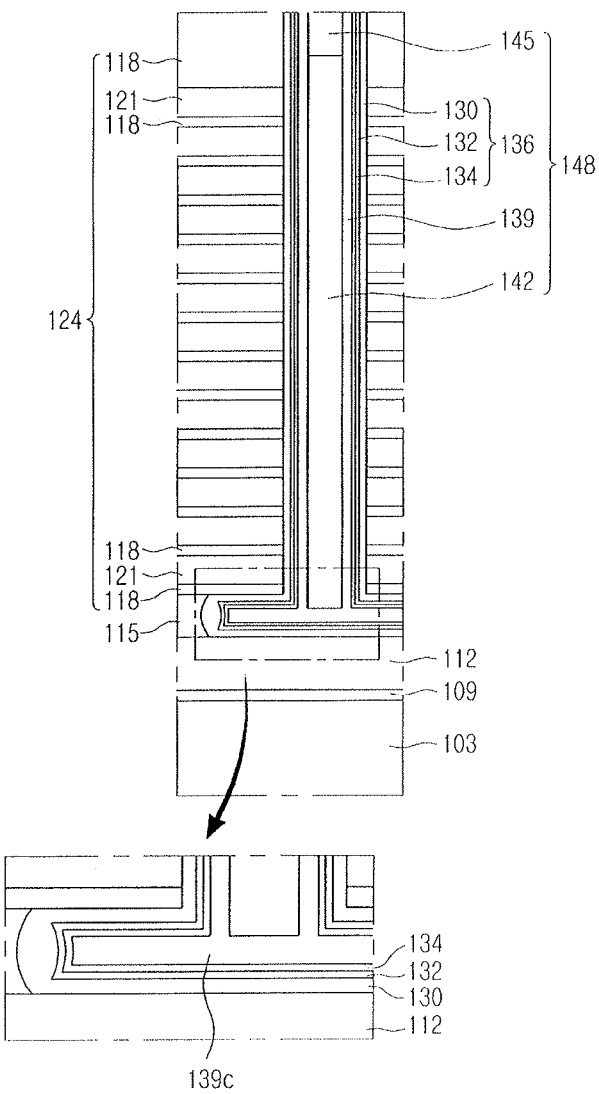
Figure 14F:
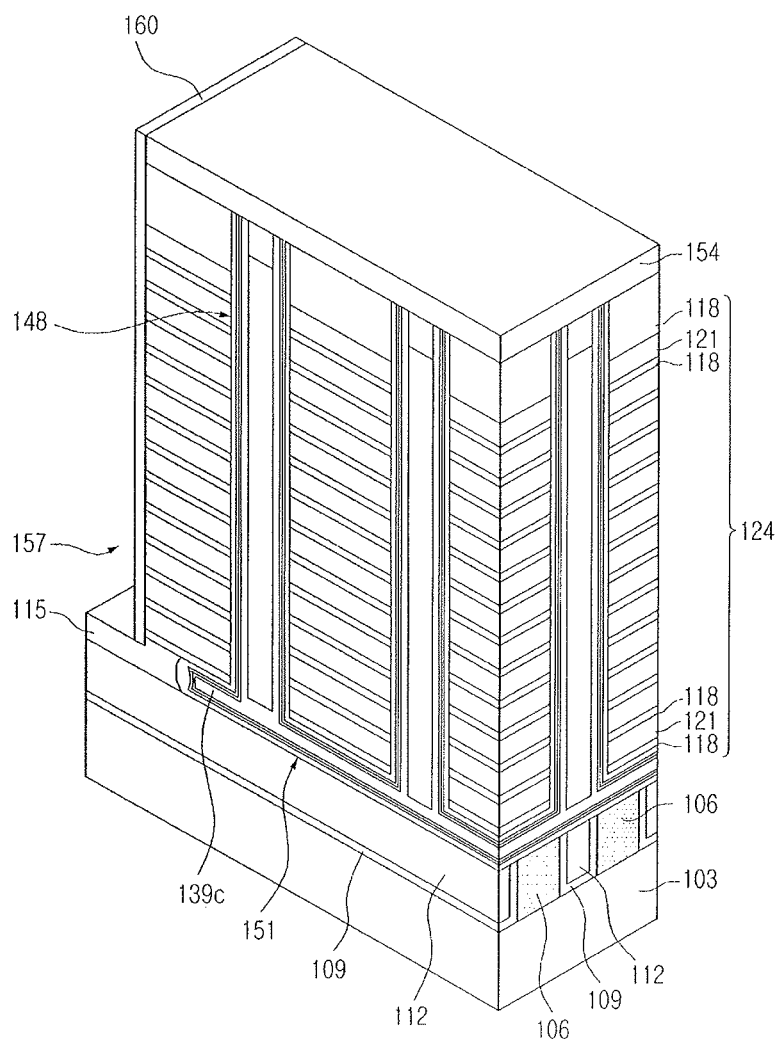
Figure 14G:
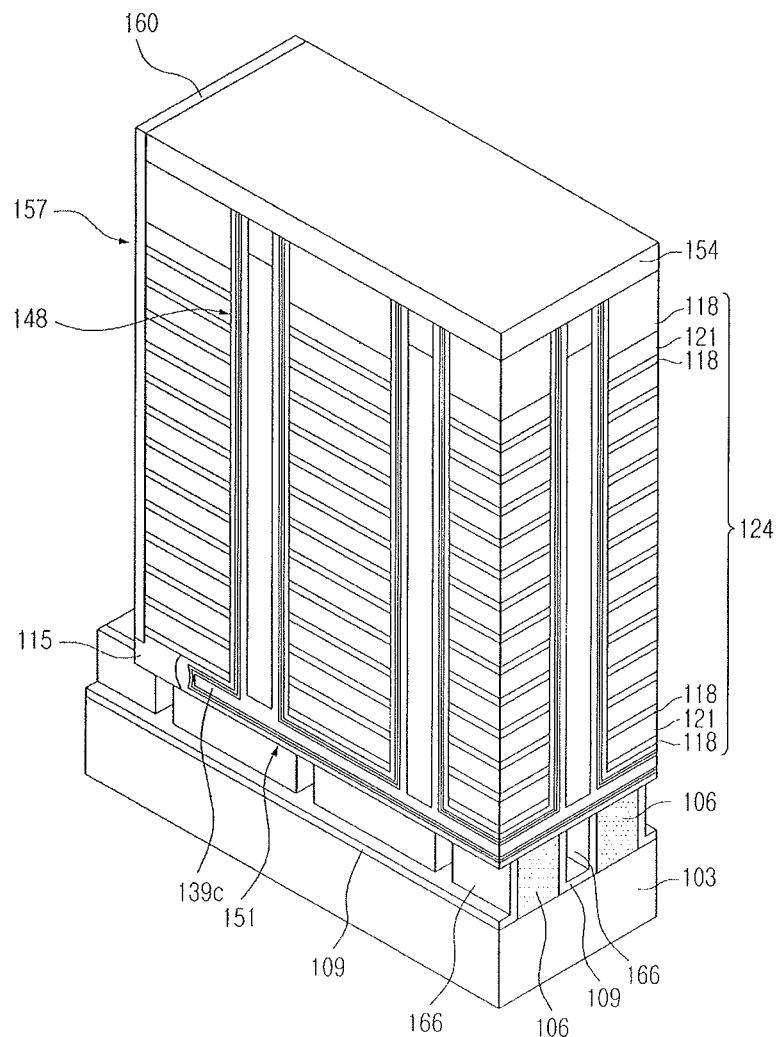
Figure 14H:
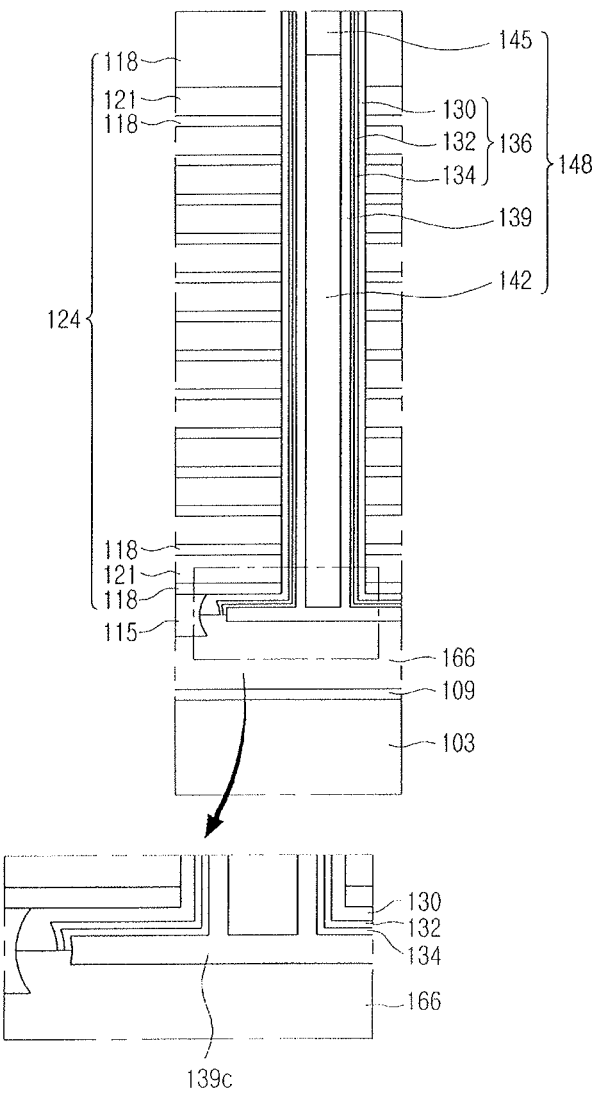

FIGS. 14A to 14K are drawings illustrating an example of a method of manufacturing the semiconductor device 100 according to example embodiments. FIGS. 14A to 14D, FIG. 14F, FIG. 14G, and FIGS. 14I to 14K are perspective views illustrating an example of a method of manufacturing the semiconductor device 100 according to the example embodiments. FIGS. 14E and 14H are cross-sectional views illustrating an example of a method of manufacturing the semiconductor device 100 according to the example embodiments. Portions "A" and "B" in FIG. 14C are plan views of an opening.

Referring to FIG. 14A, the first patterns 106 may be formed on the substrate 103 to be spaced apart from each other. The substrate 103 may be a semiconductor substrate. The first patterns 106 may be formed on the substrate 103 to have a pillar shape, and may be formed of an insulating material, e.g., a silicon oxide. A second layer and a sacrificial layer may be formed on the substrate including the first patterns 106, and a planarization process may be performed thereon until the first patterns 106 are exposed. Thus, the second pattern 109 may be formed to cover sidewalls of the first patterns 106 and the substrate between the first patterns 106. The sacrificial pattern 112 may be formed on the second pattern 109 to fill space between the first patterns 106. The second pattern 109 may be formed of a semiconductor material or a silicon material. The second pattern 109 may be formed of carbon doped polysilicon. The sacrificial pattern 112 may be formed of, e.g., a silicon nitride.

With reference to FIG. 14B, a lower layer 114 may be formed on the substrate including the first and second patterns 106 and 109 and the sacrificial pattern 112. The lower layer 114 may be formed of a semiconductor material or a silicon material. For example, the lower layer 114 may be formed of carbon-doped polysilicon.

A molded structure 124 may be formed on the lower layer 114. The molded structure 124 may include the interlayer insulating layers 118 and sacrificial gate layers 121 alternately stacked on each other. In the case of the molded structure 124, a lowermost layer and an uppermost layer may be interlayer insulating layers.

Referring to FIG. 14C, holes 127h may be formed to penetrate through the molded structure 124 and allow the lower layer 114 (see FIG. 14B) to be exposed. The lower layer 114 (see FIG. 14B) exposed by the holes 127h may be etched to form the lower pattern 115 and a lower opening 127c connected to the holes 127h. The holes 127h and the lower opening 127c may be referred to as the opening 127. The opening 127 may include the first and second hole regions 127a and 127b corresponding to the first and second hole regions 15a and 15b illustrated in FIG. 10A.

Referring to FIGS. 14D and 14E, the first dielectric layer 130, the second dielectric layer 132, the third dielectric layer 134, and the semiconductor layer 139 may be sequentially formed on the substrate having the opening 127. The core pattern 142 filling the opening 127 may be formed on the semiconductor layer 139. The core pattern 142 may then be recessed, and the pad 145 may be formed thereon. Then, a planarization process may be performed thereon until an uppermost interlayer insulating layer 118 of the molded structure 124 is exposed. The first to third dielectric layers 130, 132 and 134 may configure the dielectric structure 136.

The dielectric structure 136, the semiconductor layer 139, the core pattern 142 and the pad 145 disposed in the holes 127h of the opening 127 may be referred to as vertical structures 148. The dielectric structure 136, the semiconductor layer 139, and the core pattern 142 disposed in the connection opening 127c may be referred to as a connection structure 151.

The first dielectric layer 130 may be formed using one of the methods of forming the first dielectric layer 26 described above with reference to FIGS. 10A to 13. For example, a process of forming the first dielectric layer 130 may be identical to the process of forming the sacrificial layer 21 (see FIG. 10A) and forming the first dielectric layer 26 (see FIG. 10B) by performing the oxidation process (24, see FIG. 10B) of oxidizing the sacrificial layer 21 (FIG. 10A), as described in FIGS. 10A and 10B.

The first dielectric layer 130 may include an oxidized portion formed by oxidizing a portion of the lower pattern 115. Thus, a portion of the first dielectric layer 130, contacting the lower pattern 115, may have a thickness greater than a thickness of a portion thereof facing sidewalls of the holes 127h. In addition, in the case of the lower pattern 115, a surface of a portion thereof in contact with the first dielectric layer 130 may be concave.

Referring to FIG. 14F, an upper insulating layer 154 covering the molded structure 124 and the vertical structures 148 may be formed. A separation opening 157 penetrating through the upper insulating layer 154 and the molded structure 124 while allowing the lower pattern 115 to be exposed may be formed. A protective spacer 160 may be formed on a sidewall of the separation opening 157.

Referring to FIG. 14G, the sacrificial pattern 112 (see FIG. 14F) may be exposed by etching the lower pattern 115. Subsequently, empty spaces 166 may be formed by removing the sacrificial pattern 112 (see FIG. 14F). Thus, the empty spaces 166 may allow the dielectric structure 136 of the connection structure 151 to be exposed.

Referring to FIG. 14H, the dielectric structure 136 exposed by the empty spaces 166 and located below a semiconductor connection layer 139c may be etched and removed. Thus, the empty spaces 166 may be extended to allow a lower surface of the semiconductor connection layer 139c and a portion of a side of the semiconductor connection layer 139c to be exposed.

Figure 14I:
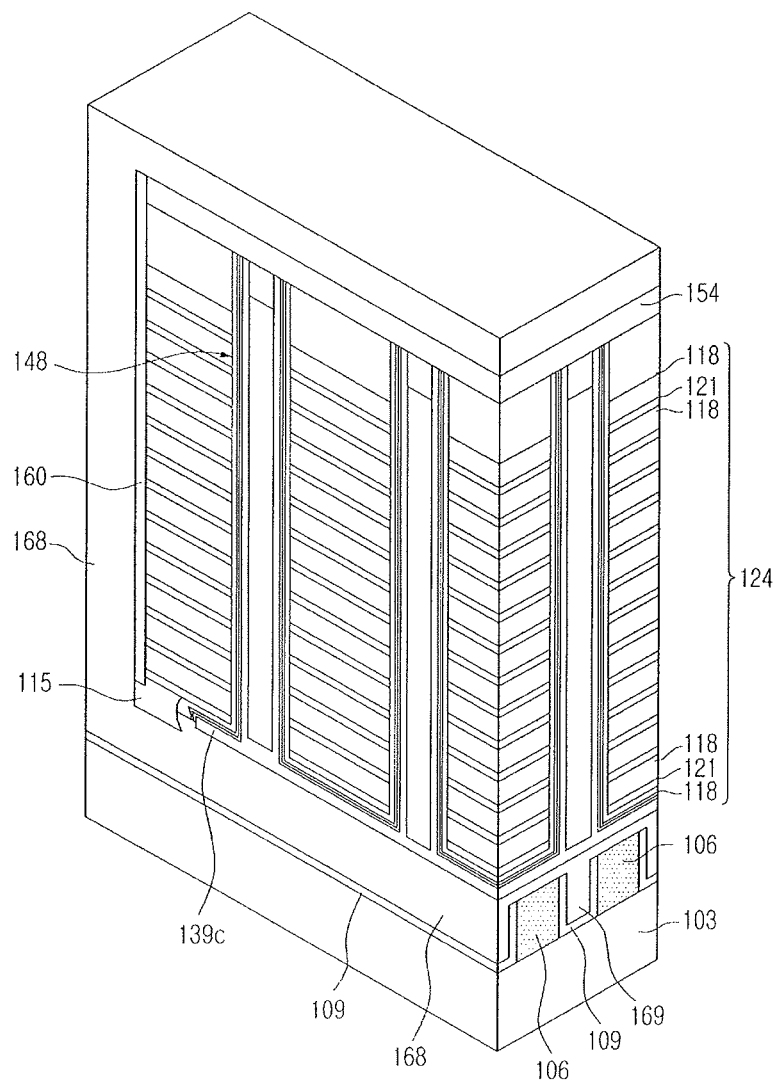

Referring to FIG. 14I, a connecting material layer 168 may be formed on the substrate including the extended empty spaces 166 (FIG. 14H). The connecting material layer 168 may contact the semiconductor connection layer 139c and the lower pattern 115 while filling the extended empty spaces 166 (see FIG. 14H). The connecting material layer 168 may be formed of a semiconductor material or a silicon material.

Figure 14J:
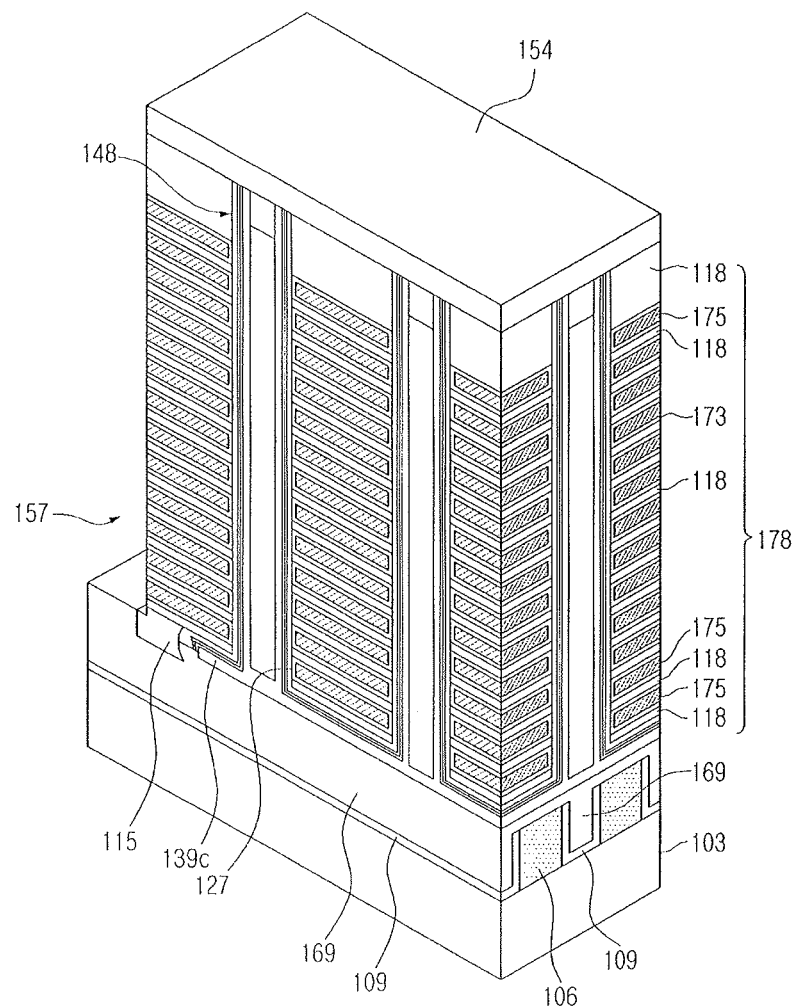

Referring to FIG. 14J, a connection pattern 169 may be formed by partially etching the connecting material layer 168 to a level of a lower portion of the separation opening 157. Next, a sidewall of the molded structure 124 (see FIG. 14I) may be exposed by removing the protective spacer 160 (see FIG. 14I). Subsequently, a gate forming process substantially the same as described above with reference to FIGS. 10G and 10H may be performed. For example, empty spaces may be formed by removing the sacrificial gate layers 121 of the molded structure 124 (FIG. 14I), and within the empty spaces, fourth dielectric layers 173 conformally covering inner walls of the empty spaces and gate electrodes 175 filling the empty spaces may be formed as described above with reference to FIG. 10H.

Figure 14K:
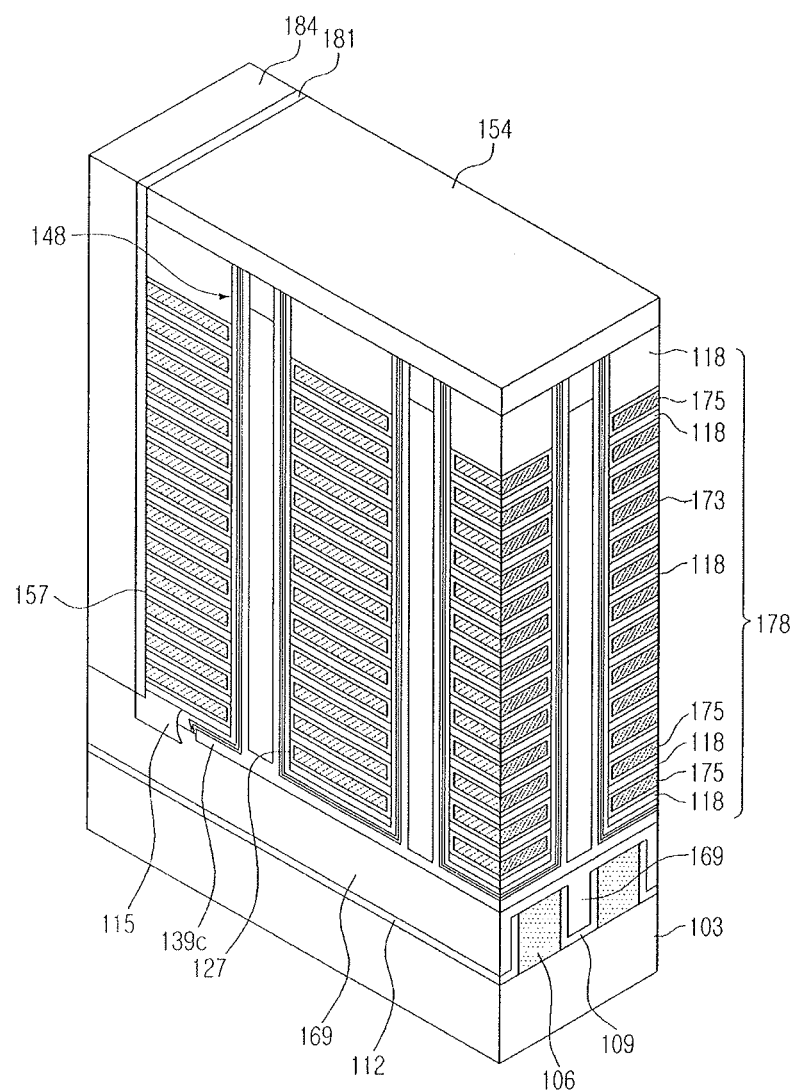

Referring to FIG. 14K, an insulating spacer 181 may be formed on a sidewall of the separation opening 157, and a separation pattern 184 may be formed to fill the separation opening 157. Subsequently, a process of forming the contact plugs 187 and the bit lines 190 as described above with reference to FIG. 6 may be performed. Thus, the semiconductor device 100 as described above with reference to FIG. 6 may be formed.

Figure 15A:
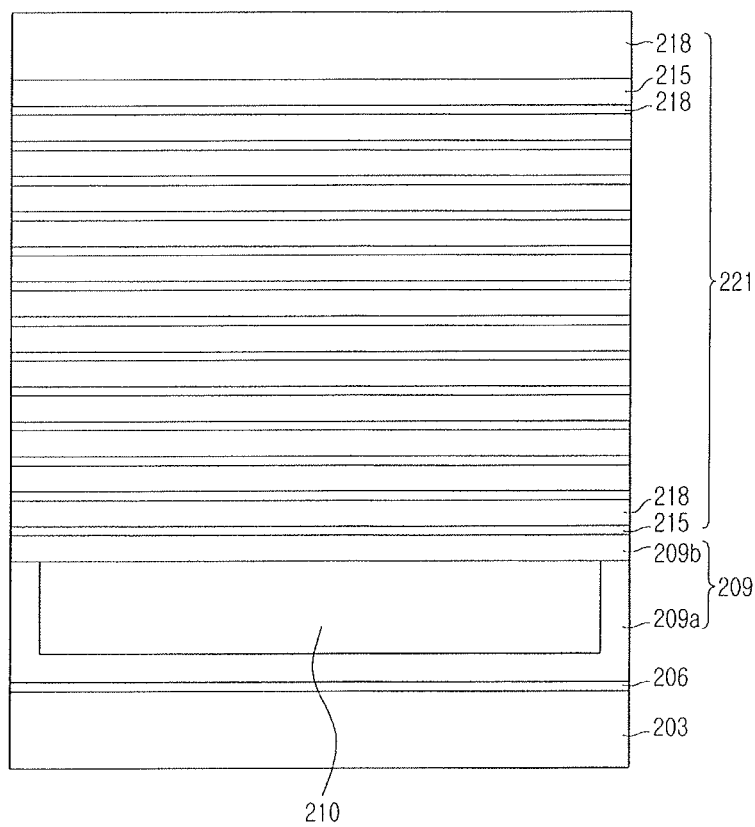
FIGS. 15A to 15C illustrate cross-sectional views of stages in a method of manufacturing a semiconductor device according to another example embodiment.
Figure 15B:
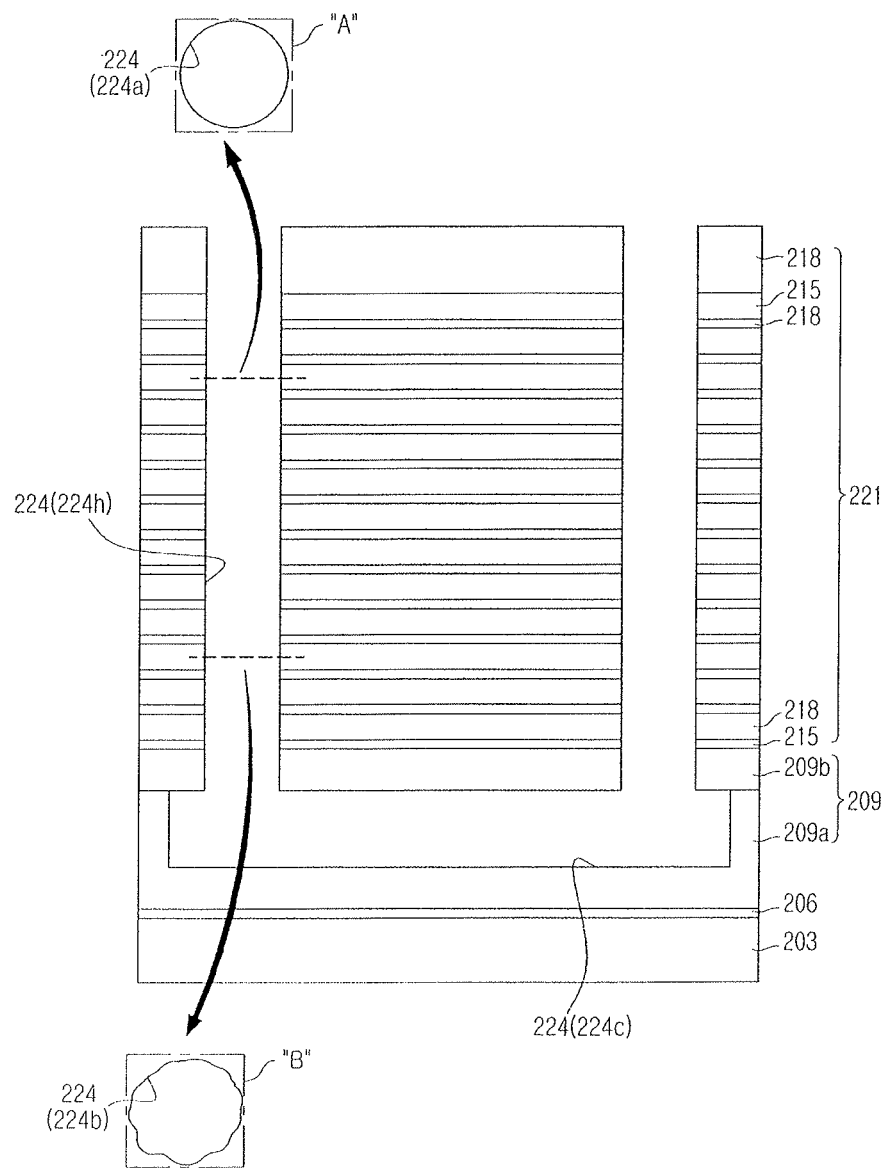
Figure 15C:
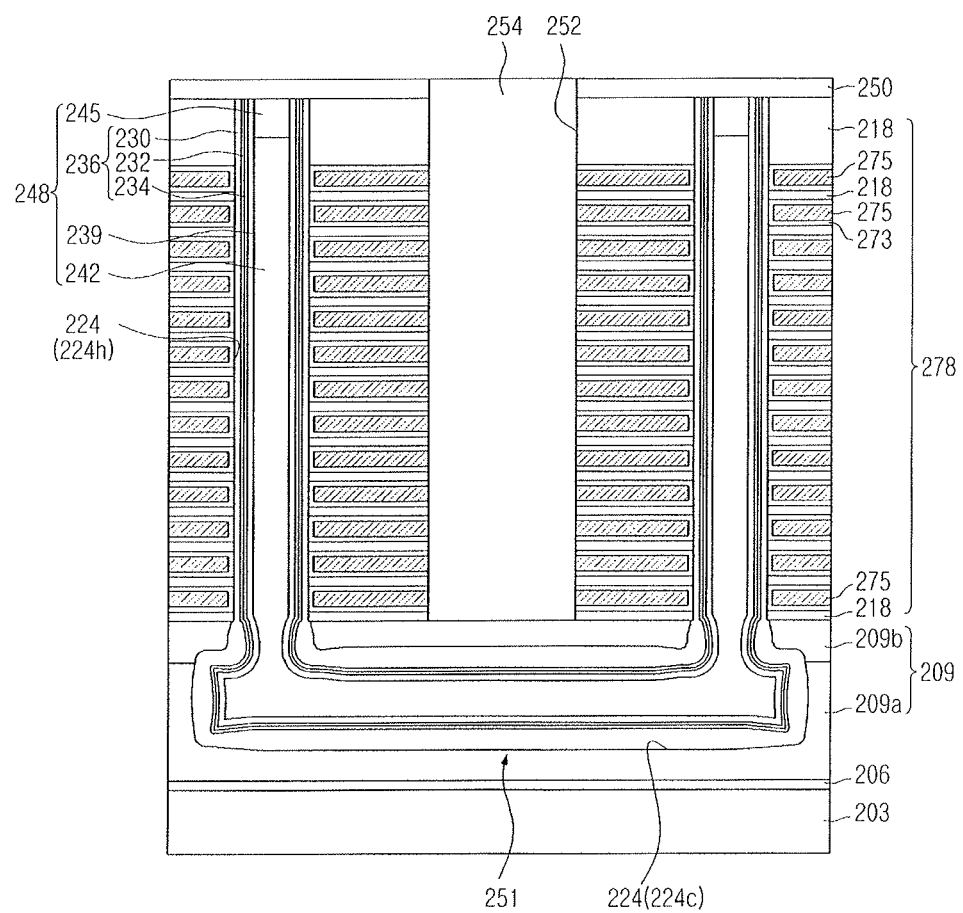

FIGS. 15A to 15C are cross-sectional views illustrating an example of a method of manufacturing the semiconductor device 200 according to the example embodiments.

Referring to FIG. 15A, a lower insulating layer 206 may be formed on a substrate 203. A lower pattern 209 including a sacrificial pattern 210 embedded therein may be formed on the lower insulating layer 206. The lower pattern 209 may include a first lower pattern 209a, the sacrificial pattern 210 provided inside the first lower pattern 209a, and a second lower pattern 209b covering the first lower pattern 209a and the sacrificial pattern 210. The lower pattern 209 may be formed of a semiconductor material or doped polysilicon. The sacrificial pattern 210 may be formed of a material having etch selectivity with respect to the lower pattern 209. A molded structure 221 may be formed on the lower pattern 209. The molded structure 221 may include sacrificial gate layers 215 and interlayer insulating layers 218 alternately stacked on each other.

Referring to FIG. 15B, holes 224h penetrating through the molded structure 221 to allow the sacrificial pattern 210 (see FIG. 15A) to be exposed may be formed. Then, the sacrificial pattern 210 (FIG. 15A) exposed by the holes 224h may be removed to form a connection opening 224c. The holes 224h and the connection opening 224c may be referred to as an opening 224. The holes 224h of the opening 224 may include first and second hole regions 224a and 224b corresponding to the first and second hole regions 15a and 15b described above with reference to FIG. 10A.

Referring to FIG. 15C, a first dielectric layer 230, a second dielectric layer 232, a third dielectric layer 234, and a semiconductor layer 239 may be sequentially formed on a substrate having the opening 224. A core pattern 242 filling the opening 224 may be formed on the semiconductor layer 239. The core pattern 242 may then be recessed, and a pad 245 may be formed thereon. Then, a planarization process may be performed thereon until an uppermost interlayer insulating layer 218 of the molded structure 221 (see FIG. 15B) is exposed. The first to third dielectric layers 230, 232 and 234 may configure a dielectric structure 236.

The dielectric structure 236, the semiconductor layer 239, the core pattern 242 and the pad 245 disposed in the holes 224h of the opening 224 may be referred to as vertical structures 248. The dielectric structure 236, the semiconductor layer 239, and the core pattern 242 disposed in the connection opening 224c may be referred to as a connection structure 251.

The first dielectric layer 230 may be formed using one of the methods of forming the first dielectric layer 26 described above with reference to FIGS. 10A to 13. For example, a process of forming the first dielectric layer 230 may be identical to the process of forming the sacrificial layer 21 (see FIG. 10A) and forming the first dielectric layer 26 (see FIG. 10B) by performing the oxidation process (24, see FIG. 10B) of oxidizing the sacrificial layer 21 (FIG. 10A), as described in FIGS. 10A and 10B. The first dielectric layer 230 may include an oxidized portion formed by oxidizing a portion of the lower pattern 209. Thus, a portion of the first dielectric layer 230, contacting the lower pattern 209, may have a thickness greater than a thickness of a portion thereof facing sidewalls of the holes 224h. Thus, the lower pattern 209 and the first dielectric layer 230 as described above with reference to FIGS. 8 and 9A may be formed.

A first upper insulating layer 250 covering the molded structure 221 (see FIG. 15B) and the vertical structures 248 may be formed. A separation opening 252 penetrating through the first upper insulating layer 250 and the molded structure 221 (see FIG. 15B) may be formed.

Subsequently, a gate forming process substantially the same as described above with reference to FIGS. 10G and 10H may be performed. For example, empty spaces may be formed by removing the sacrificial gate layers 215 of the molded structure 221 (FIG. 15B), and within the empty spaces, fourth dielectric layers 273 conformally covering inner walls of the empty spaces and gate electrodes 275 filling the empty spaces may be formed as described above with reference to FIG. 10H.

Referring again to FIG. 8, a source contact plug 280 penetrating through the first upper insulating layer 250 and electrically connected to the pad 245 of one of the vertical structures 248, and a source line 282 electrically connected to the source contact plug 280 may be formed. A second upper insulating layer 284 covering the source line 282 and the first upper insulating layer 250 may be formed. A bit line contact plug 286 penetrating through the first and second upper insulating layers 250 and 284 to be electrically connected to the other vertical structure 248, not connected to the source contact plug 280, among the vertical structures 248 on two sides of the separation pattern 254 may be formed, and a bit line 290 electrically connected to the bit line contact plug 286 may be formed.

According to example embodiments, a method of forming a semiconductor device includes forming a dielectric layer by forming an oxide layer on a bottom and an inner wall of a hole having a lower portion with a distorted circular shape, such that the oxide layer has a required thickness in both concave and convex regions of the distorted circular shape. That is, a, e.g., silicon, source layer is formed on the bottom and inner wall of the hole, followed by an oxidation process (without oxygen radicals) completely oxidizing the source layer, e.g., to ensure proper oxidation and thickness in both concave/convex portions in the bottom of the hole, without oxidizing a molded structure underneath the silicon source layer (due to lack of oxygen radicals). As such, the resultant oxidized layer defines a dielectric layer in the hole region with improved reliability and improve cell distribution characteristics in semiconductor devices. Further, as set forth above, a semiconductor device including a reliable dielectric layer with improved cell distribution characteristics may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a stack structure on a substrate, the stack structure including interlayer insulating layers and word lines alternately stacked on each other;
   a hole penetrating through the stack structure;
   a vertical structure disposed in the hole, the vertical structure including a semiconductor layer in the hole, a first dielectric layer between the semiconductor layer and the stack structure, and a pad contacting an upper region of the semiconductor layer; and
   a lower pattern closer to the substrate than to the word lines,
   wherein the first dielectric layer includes:
      a first portion extending along a depth direction of the hole and facing the stack structure, and
      a second portion extending from a bottom of the first portion toward a central axis of the hole, the second portion facing the lower pattern and having a thickness greater than a thickness of the first portion, and
   wherein the lower pattern includes a first surface facing the second portion of the first dielectric layer to contact therewith, and a second surface facing a sidewall of the hole while defining an acute angle with the first surface.

2. The semiconductor device as claimed in claim 1, further comprising:
   a separation pattern penetrating through the stack structure; and
   a bit line electrically connected to the pad of the vertical structure.

3. The semiconductor device as claimed in claim 1, wherein a thickness of at least a portion of the second portion of the first dielectric layer has an increasing thickness from the first portion toward the central axis of the hole.

4. The semiconductor device as claimed in claim 1, wherein:
   the vertical structure further includes a second dielectric layer, a third dielectric layer, and a core pattern,
   the second dielectric layer is between the first dielectric layer and the third dielectric layer,
   the pad is on the core pattern,
   the semiconductor layer covers a side surface and a bottom surface of the core pattern, and
   a bottom surface of the semiconductor layer contacts the lower pattern.

5. The semiconductor device as claimed in claim 4, further comprising a lower gate electrode below the word lines while being disposed on the substrate, the hole penetrating through the lower gate electrode, and the lower pattern being in the hole and including a side surface facing the lower gate electrode.

6. A semiconductor device, comprising:
   a stack structure on a substrate, the stack structure including interlayer insulating layers and word lines alternately stacked on each other;
   a hole penetrating through the stack structure;
   a vertical structure disposed in the hole, the vertical structure including a semiconductor layer in the hole, a first dielectric layer between the semiconductor layer and the stack structure, and a pad contacting an upper region of the semiconductor layer; and
   a lower pattern closer to the substrate than to the word lines,
   wherein the first dielectric layer includes a first portion facing the stack structure, and a second portion facing the lower pattern and having a thickness greater than a thickness of the first portion, and
   wherein the hole includes a first hole region and a second hole region below the first hole region, the first hole region having a shape closer to a circular shape than a shape of the second hole region thereto, and the second hole region including a concave portion and a convex portion on a same plane.

7. The semiconductor device as claimed in claim 6, wherein the first dielectric layer includes portions having different thicknesses on a same plane within the second hole region.

8. The semiconductor device as claimed in claim 6, wherein the lower pattern includes an upper surface facing a bottom surface of the second portion of the first dielectric layer to contact therewith, and a lateral surface facing a sidewall of the hole while defining an acute angle with the upper surface.

9. The semiconductor device as claimed in claim 6, wherein:
   the vertical structure further includes a second dielectric layer, a third dielectric layer, and a core pattern,
   the second dielectric layer is between the first dielectric layer and the third dielectric layer,
   the pad is on the core pattern,
   the semiconductor layer covers a side surface and a bottom surface of the core pattern, and
   a bottom surface of the semiconductor layer contacts the lower pattern.

10. The semiconductor device as claimed in claim 9, further comprising a lower gate electrode below the word lines while being disposed on the substrate, the hole penetrating through the lower gate electrode, and the lower pattern being in the hole and including a side surface facing the lower gate electrode.

11. The semiconductor device as claimed in claim 6, wherein the lower pattern includes a recessed portion recessed from an upper portion of the lower pattern, the recessed portion being in contact with the semiconductor layer.

12. A semiconductor device, comprising:
   a stack structure on a substrate, the stack structure including interlayer insulating layers and word lines alternately stacked on each other;
   a hole penetrating through the stack structure;
   a vertical structure disposed in the hole, the vertical structure including a semiconductor layer in the hole, a first dielectric layer between the semiconductor layer and the stack structure, and a pad contacting an upper region of the semiconductor layer; and
   a lower pattern closer to the substrate than to the word lines,
   wherein the first dielectric layer includes:
      a first portion extending along a depth direction of the hole and facing the stack structure, and
      a second portion extending from a bottom of the first portion toward a central axis of the hole, the second portion facing the lower pattern and having a thickness greater than a thickness of the first portion, and
   wherein the lower pattern includes a recessed portion recessed from an upper portion of the lower pattern, the recessed portion being in contact with the semiconductor layer.

* * * * *